(12) United States Patent
Sasaki

(10) Patent No.: US 11,014,256 B2
(45) Date of Patent: *May 25, 2021

(54) SEMICONDUCTOR MEMORY DEVICE AND METHOD FOR MANUFACTURING SAME

(71) Applicant: Toshiba Memory Corporation, Tokyo (JP)

(72) Inventor: Toshiyuki Sasaki, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/872,485

(22) Filed: May 12, 2020

(65) Prior Publication Data

US 2020/0269456 A1 Aug. 27, 2020

Related U.S. Application Data

(63) Continuation of application No. 16/439,766, filed on Jun. 13, 2019, now Pat. No. 10,682,779, which is a
(Continued)

(51) Int. Cl.
| | | |
|---|---|---|
| *B26B 29/02* | (2006.01) | |
| *H01L 27/11582* | (2017.01) | |
| *H01L 27/11578* | (2017.01) | |
| *H01L 29/792* | (2006.01) | |
| *G11C 16/10* | (2006.01) | |
| *H01L 23/528* | (2006.01) | |
| *H01L 23/532* | (2006.01) | |
| *H01L 27/1157* | (2017.01) | |
| *H01L 21/311* | (2006.01) | |

(Continued)

(52) U.S. Cl.
CPC ............ *B26B 29/025* (2013.01); *A45F 5/021* (2013.01); *B24B 3/54* (2013.01); *G11C 16/10* (2013.01); *H01L 21/31116* (2013.01); *H01L 23/528* (2013.01); *H01L 23/53257* (2013.01); *H01L 23/53261* (2013.01); *H01L 27/1157* (2013.01); *H01L 27/11578* (2013.01); *H01L 27/11582* (2013.01); *H01L 29/7926* (2013.01); *H01L 29/1037* (2013.01); *H01L 2924/0002* (2013.01)

(58) Field of Classification Search
None
See application file for complete search history.

(56) References Cited

U.S. PATENT DOCUMENTS

| | | |
|---|---|---|
| 7,884,417 B2 | 2/2011 | Mizukami et al. |
| 8,198,669 B2 | 6/2012 | Omura |

(Continued)

*Primary Examiner* — Angel Roman
(74) *Attorney, Agent, or Firm* — Finnegan, Henderson, Farabow, Garrett & Dunner L.L.P.

(57) ABSTRACT

According to one embodiment, the stacked body includes a plurality of stacked units and a first intermediate layer. Each of the stacked units includes a plurality of electrode layers and a plurality of insulating layers. Each of the insulating layers is provided between the electrode layers. The first intermediate layer is provided between the stacked units. The first intermediate layer is made of a material different from the electrode layers and the insulating layers. The plurality of columnar portions includes a channel body extending in a stacking direction of the stacked body to pierce the stacked body, and a charge storage film provided between the channel body and the electrode layers.

20 Claims, 22 Drawing Sheets

Related U.S. Application Data continuation of application No. 15/818,793, filed on Nov. 21, 2017, now Pat. No. 10,369,715, which is a continuation of application No. 15/427,676, filed on Feb. 8, 2017, now Pat. No. 9,865,618, which is a continuation of application No. 15/213,537, filed on Jul. 19, 2016, now Pat. No. 9,608,002, which is a continuation of application No. 14/958,995, filed on Dec. 4, 2015, now Pat. No. 9,425,211, which is a continuation of application No. 14/464,223, filed on Aug. 20, 2014, now Pat. No. 9,236,395.

(60) Provisional application No. 62/016,908, filed on Jun. 25, 2014.

(51) Int. Cl.
*A45F 5/02* (2006.01)
*B24B 3/54* (2006.01)
*H01L 29/10* (2006.01)

(56) References Cited

U.S. PATENT DOCUMENTS

| | | | |
|---|---|---|---|
| 8,278,170 B2 | 10/2012 | Lee et al. | |
| 8,372,720 B2 | 2/2013 | Fukuzumi et al. | |
| 8,409,977 B2 | 4/2013 | Shim et al. | |
| 8,487,365 B2 | 7/2013 | Sasaki et al. | |
| 9,111,799 B2 | 8/2015 | Hwang et al. | |
| 9,236,395 B1 * | 1/2016 | Sasaki | H01L 21/31116 |
| 9,425,211 B2 | 8/2016 | Sasaki | |
| 9,608,002 B2 * | 3/2017 | Sasaki | A45F 5/021 |
| 10,369,715 B2 * | 8/2019 | Sasaki | H01L 29/7926 |
| 10,682,779 B2 * | 6/2020 | Sasaki | H01L 23/53261 |
| 2009/0230458 A1 | 9/2009 | Ishiduki et al. | |
| 2009/0230459 A1 | 9/2009 | Kito et al. | |
| 2011/0291178 A1 | 12/2011 | Sasaki et al. | |
| 2012/0003800 A1 * | 1/2012 | Lee | H01L 27/11578 |
| | | | 438/261 |
| 2013/0264626 A1 | 10/2013 | Sawa | |
| 2014/0239376 A1 | 8/2014 | Zhang et al. | |
| 2014/0273373 A1 | 9/2014 | Makala et al. | |
| 2015/0145021 A1 | 5/2015 | Jang et al. | |
| 2015/0263011 A1 | 9/2015 | Hong | |
| 2016/0071866 A1 | 3/2016 | Shimojo et al. | |
| 2017/0323900 A1 | 11/2017 | Kanamori | |
| 2017/0330894 A1 | 11/2017 | Lim | |
| 2018/0040629 A1 | 2/2018 | Eom | |

\* cited by examiner

SEMICONDUCTOR MEMORY DEVICE AND METHOD FOR MANUFACTURING SAME

CROSS-REFERENCE TO RELATED APPLICATION

This application is a continuation of U.S. patent application Ser. No. 16/439,766, filed Jun. 13, 2019, which is a continuation of U.S. patent application Ser. No. 15/818,793, filed Nov. 21, 2017 (now U.S. Pat. No. 10,369,715), which is a continuation of U.S. patent application Ser. No. 15/427,676, filed Feb. 8, 2017 (now U.S. Pat. No. 9,865,618), which is a continuation of U.S. patent application Ser. No. 15/213,537, filed Jul. 19, 2016 (now U.S. Pat. No. 9,608,002), which is a continuation of U.S. patent application Ser. No. 14/958,995, filed Dec. 4, 2015 (now U.S. Pat. No. 9,425,211), which is a continuation of U.S. patent application Ser. No. 14/464,223, filed Aug. 20, 2014 (now U.S. Pat. No. 9,236,395), all of which are based upon and claim the benefit of priority from U.S. Provisional Patent Application 62/016,908, filed on Jun. 25, 2014, the entire contents of all of which are incorporated herein by reference.

FIELD

Embodiments described herein relate generally to a semiconductor memory device and a method for manufacturing the same.

BACKGROUND

A memory device having a three-dimensional structure has been proposed in which memory holes are made in a stacked body in which electrode layers that function as control gates of memory cells are multiply stacked with insulating layers interposed between the electrode layers, and silicon bodies used to form channels are provided on the side walls of the memory holes with a charge storage film interposed between the silicon bodies and the side walls.

In such a three-dimensional device, the memory holes and slits are made in the stacked body that includes the multiple layers of electrode layers and the multiple layers of insulating layers by, for example, RIE (Reactive Ion Etching). High shape controllability and dimensional controllability are desirable for the etching in such a case.

DETAILED DESCRIPTION

Figure 1:
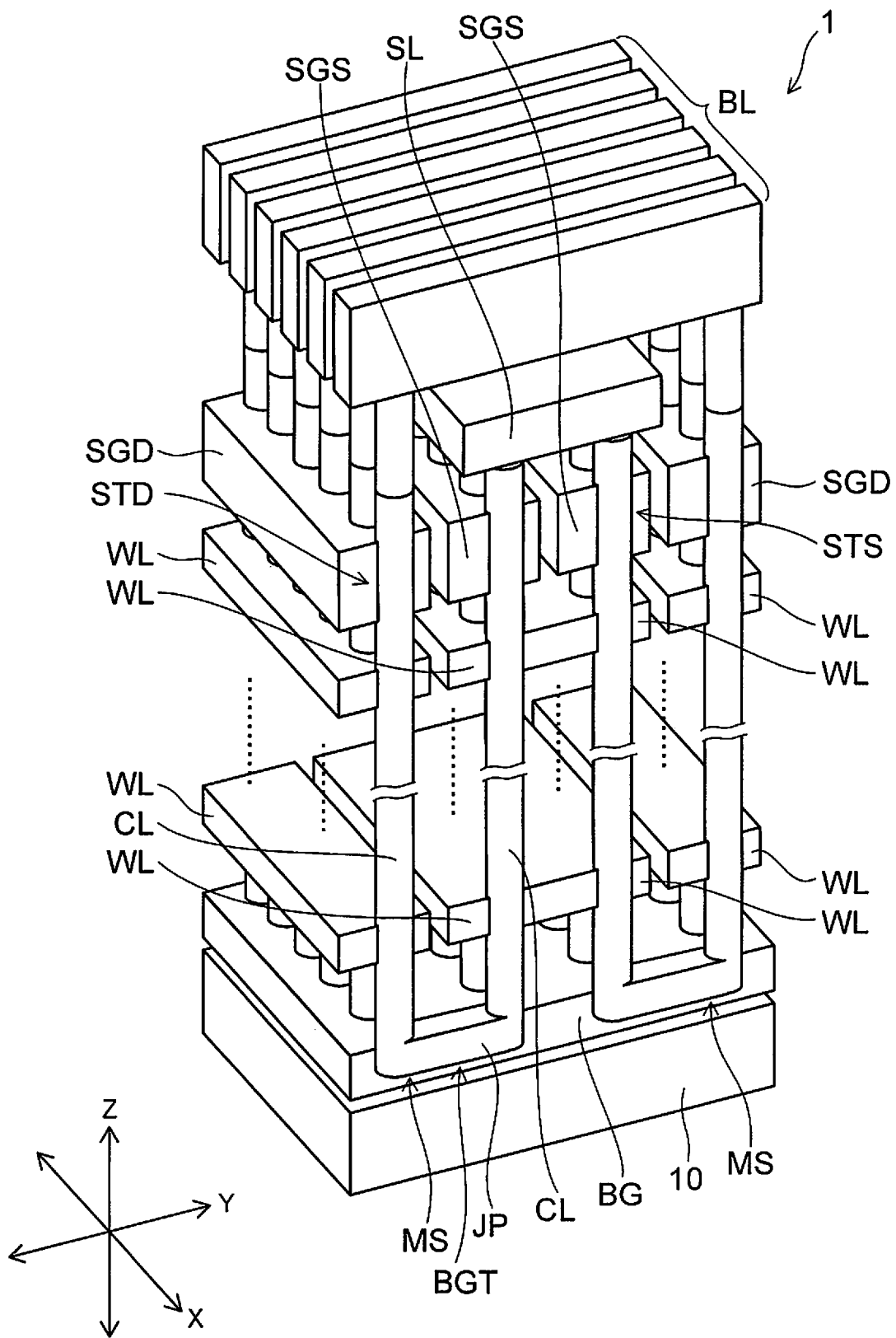
FIG. 1 is a schematic perspective view of a memory cell array of an embodiment.

According to one embodiment, a semiconductor memory device includes a stacked body and a plurality of columnar portions. The stacked body includes a plurality of stacked units and a first intermediate layer. Each of the stacked units includes a plurality of electrode layers and a plurality of insulating layers. Each of the insulating layers is provided between the electrode layers. The first intermediate layer is provided between the stacked units. The first intermediate layer is made of a material different from the electrode layers and the insulating layers. The plurality of columnar portions includes a channel body extending in a stacking direction of the stacked body to pierce the stacked body, and a charge storage film provided between the channel body and the electrode layers.

Embodiments will now be described with reference to the drawings. The same components in the drawings are marked with the same reference numerals.

FIG. 1 is a schematic perspective view of a memory cell array 1 of an embodiment. In FIG. 1, the insulating layers between the electrode layers, the insulating separation films, etc., are not shown for easier viewing of the drawings.

In FIG. 1, two mutually-orthogonal directions are taken as an X-direction and a Y-direction; and a direction orthogonal to the X-direction and the Y-direction (the XY plane) in which multiple layers of the electrode layers WL are stacked is taken as a Z-direction (a stacking direction).

The memory cell array 1 includes multiple memory strings MS.

Figure 2A:
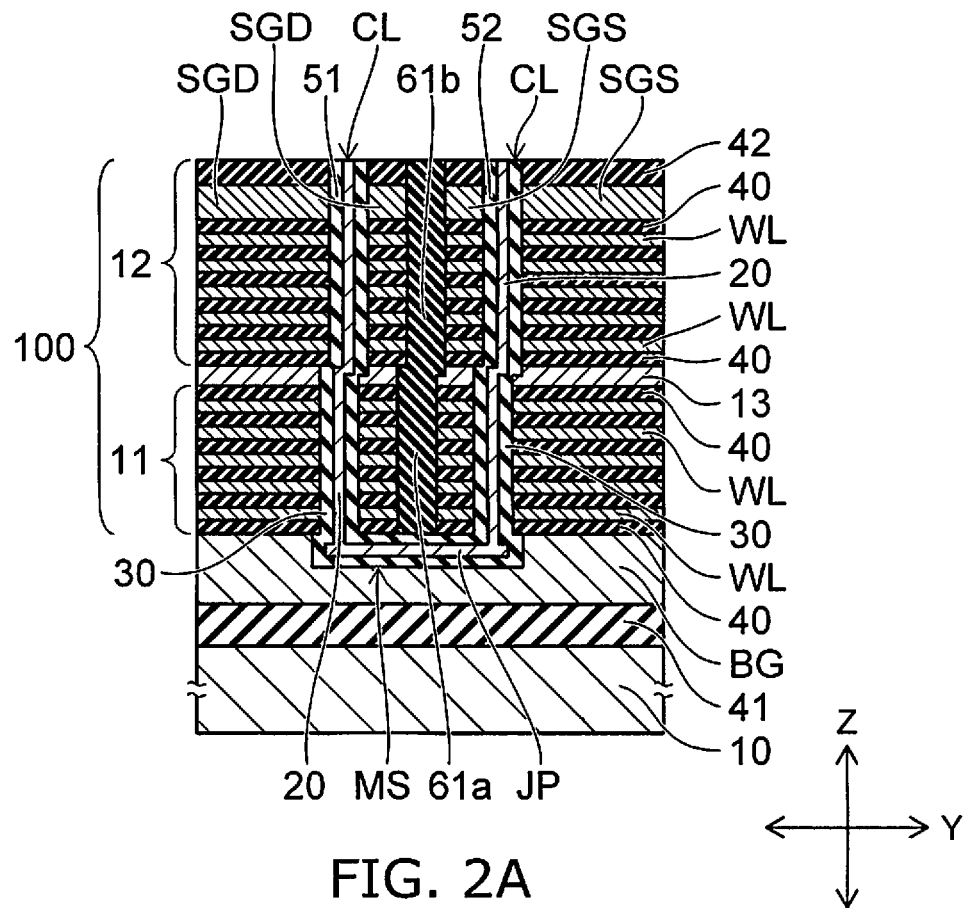
FIGS. 2A and 2B are schematic cross-sectional views of a memory string of the embodiment.

FIG. 2A is a schematic cross-sectional view of one memory string MS. FIG. 2A shows a cross section parallel to the YZ plane of FIG. 1.

The memory cell array 1 includes a stacked body 100 stacked on a substrate 10 with an insulating layer 41 and a back gate BG interposed between the stacked body 100 and the substrate 10.

The stacked body 100 includes multiple stacked units 11 and 12. Although two stacked units (the first stacked unit 11 and the second stacked unit 12) are shown in FIG. 2A, there may be three or more stacked units.

Further, the stacked body 100 includes a first intermediate layer 13 provided between the multiple stacked units (in the embodiment, between the first stacked unit 11 and the second stacked unit 12).

The first stacked unit 11 includes multiple layers of the electrode layers WL and multiple layers of insulating layers 40. One layer of the electrode layer WL and one layer of the insulating layer 40 are stacked alternately in multiple layers. The insulating layers 40 are provided between the layers of the electrode layers WL.

The first stacked unit 11 is provided on the back gate BG which is used as a lower gate layer. The back gate BG is provided on the substrate 10 with the insulating layer 41 interposed. The insulating layer 40 is provided between the back gate BG and the electrode layer WL of the lowermost layer of the first stacked unit 11.

Similarly to the first stacked unit 11, the second stacked unit 12 also includes multiple layers of the electrode layers WL and multiple layers of the insulating layers 40. In the second stacked unit 12 as well, one layer of the electrode layer WL and one layer of the insulating layer 40 are stacked alternately in multiple layers. The insulating layers 40 are provided between the layers of the electrode layers WL.

The number of layers of the electrode layers WL in the first stacked unit 11 and the second stacked unit 12 shown in the drawings is an example; and the number of layers of the electrode layers WL is arbitrary.

Further, the second stacked unit 12 includes upper gate layers (a drain-side selection gate SGD and a source-side selection gate SGS) provided on the insulating layer 40 of the uppermost layer and an insulating layer 42 provided on the upper gate layers.

The second stacked unit 12 is provided on the first stacked unit 11 with the first intermediate layer 13 interposed. The first intermediate layer 13 is provided between the insulating layer 40 of the uppermost layer of the first stacked unit 11 and the insulating layer 40 of the lowermost layer of the second stacked unit 12.

The back gate BG, the electrode layers WL, the drain-side selection gate SGD, and the source-side selection gate SGS are, for example, silicon layers including silicon as a major component. Further, the back gate BG, the electrode layers WL, the drain-side selection gate SGD, and the source-side selection gate SGS include an impurity for adding conductivity to the silicon layers. Also, the electrode layers WL, the drain-side selection gate SGD, and the source-side selection gate SGS may include a metal silicide.

The insulating layers 40, 41, and 42 are, for example, silicon oxide layers that mainly include silicon oxide.

The first intermediate layer 13 is a layer of a material different from the electrode layers WL and the insulating layers 40 and includes, for example, a metal.

As described below, the same gas is used to continuously perform etching (unselective etching) of the electrode layers WL which are silicon layers and the insulating layers 40 which are silicon oxide layers. The first intermediate layer 13 is a layer of a material having an etching rate lower than those of the electrode layers WL and the insulating layers 40 for the etching gas when etching the electrode layers WL and the insulating layers 40 and is, for example, a tungsten silicide layer.

One memory string MS is formed in a U-shaped configuration including a pair of columnar portions CL extending in the Z-direction and a connecting portion JP connecting each lower end of the pair of columnar portions CL. The columnar portions CL are formed in, for example, circular columnar or elliptical columnar configurations, pierce the stacked body 100, and reach the back gate BG.

The drain-side selection gate SGD is provided at one upper end portion of the pair of columnar portions CL of the memory string MS having the U-shaped configuration; and the source-side selection gate SGS is provided at the other upper end portion.

The drain-side selection gate SGD and the source-side selection gate SGS are divided in the Y-direction by an insulating separation film 61b. The stacked body under the drain-side selection gate SGD and the stacked body under the source-side selection gate SGS are divided in the Y-direction by the insulating separation films 61b and 61a. In other words, the stacked body 100 between the pair of columnar portions CL of the memory string MS is divided in the Y-direction by the insulating separation films 61a and 61b.

The insulating separation films 61a and 61b are filled into a slit extending in a direction piercing the page surface in FIG. 2A.

A source layer (e.g., a metal layer) SL shown in FIG. 1 is provided on the source-side selection gate SGS with the insulating layer 42 interposed.

Multiple bit lines (e.g., metal films) BL shown in FIG. 1 are provided on the drain-side selection gate SGD and on the source layer SL with the insulating layer 42 interposed between the drain-side selection gate SGD and the multiple bit lines and between the source layer SL and the multiple bit lines. Each of the bit lines BL extends in the Y-direction.

Figure 3:
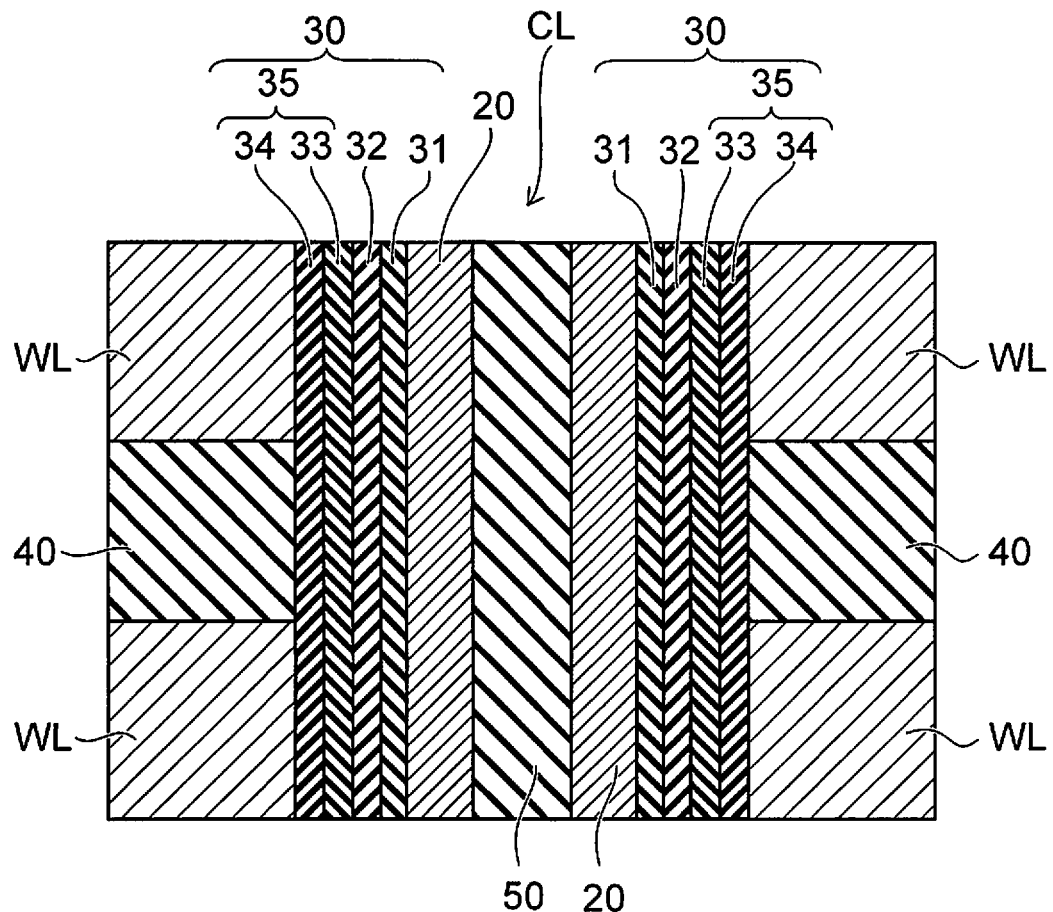
FIG. 3 is a schematic cross-sectional view of a memory cell of the embodiment.

FIG. 3 is an enlarged schematic cross-sectional view of a portion of the columnar portion CL.

The columnar portion CL is formed inside the memory hole having the U-shaped configuration made in the back gate BG and in the stacked body 100 on the back gate BG. A channel body 20 is provided as a semiconductor channel inside the memory hole. The channel body 20 is, for example, a silicon film. The impurity concentration of the channel body 20 is lower than the impurity concentration of the electrode layers WL.

A memory film 30 is provided between the channel body 20 and the inner wall of the memory hole. The memory film 30 includes a blocking insulating film 35, a charge storage film 32, and a tunneling insulating film 31.

The blocking insulating film 35, the charge storage film 32, and the tunneling insulating film 31 are provided in order from the electrode layer WL side between the channel body 20 and the electrode layers WL.

The channel body 20 is provided in a tubular configuration extending in the stacking direction of the stacked body 100; and the memory film 30 is provided in a tubular configuration extending in the stacking direction of the stacked body 100 and provided around the outer circumferential surface of the channel body 20.

The electrode layers WL are provided around the channel body 20 with the memory film 30 interposed between the channel body 20 and the electrode layers WL. Also, a core insulating film 50 is provided inside the channel body 20. The core insulating film 50 is, for example, a silicon oxide film.

The blocking insulating film 35 contacts the electrode layers WL; the tunneling insulating film 31 contacts the channel body 20; and the charge storage film 32 is provided between the blocking insulating film 35 and the tunneling insulating film 31.

The channel body 20 functions as the channels of the memory cells; and the electrode layers WL function as the control gates of the memory cells. The charge storage film 32 functions as a data storage layer that stores the charge injected from the channel body 20. In other words, the memory cells having a structure in which the control gate is provided around the channel are formed at the intersections between the channel body 20 and each of the electrode layers WL.

The semiconductor memory device of the embodiment is a nonvolatile semiconductor memory device that can freely and electrically erase/program data and retain the memory content even when the power supply is OFF.

The memory cell is, for example, a charge trap memory cell. The charge storage film 32 has many trap sites that trap the charge and is, for example, a silicon nitride film.

The tunneling insulating film 31 is used as a potential barrier when the charge is injected from the channel body 20 into the charge storage film 32 or when the charge stored in the charge storage film 32 diffuses into the channel body 20. The tunneling insulating film 31 is, for example, a silicon oxide film.

Or, a stacked film (an ONO film) that has a structure in which a silicon nitride film is interposed between a pair of silicon oxide films may be used as the tunneling insulating film. In the case where the ONO film is used as the tunneling insulating film, the erasing operation is performed by an electric field that is lower than for a single layer of a silicon oxide film.

The blocking insulating film 35 prevents the charge stored in the charge storage film 32 from diffusing into the electrode layers WL. The blocking insulating film 35 includes a capping film 34 provided to contact the electrode layers WL, and a blocking film 33 provided between the capping film 34 and the charge storage film 32.

The blocking film 33 is, for example, a silicon oxide film. The capping film 34 is a film having a dielectric constant that is higher than that of silicon oxide, e.g., a silicon nitride film. By providing such a capping film 34 to contact the electrode layers WL, the injection of the back-tunneling electrons from the electrode layers WL in the erasing can be suppressed. By using a stacked film of a silicon oxide film and a silicon nitride film as the blocking insulating film 35, the charge blocking properties can be increased.

As shown in FIG. 1, a drain-side selection transistor STD is provided at one upper end portion of the pair of columnar portions CL of the memory string MS having the U-shaped configuration; and a source-side selection transistor STS is provided at the other upper end portion.

The drain-side selection gate SGD functions as the gate electrode (the control gate) of the drain-side selection transistor STD. An insulating film 51 (FIG. 2A) that functions as the gate insulator film of the drain-side selection transistor STD is provided between the drain-side selection gate SGD and the channel body 20. The channel body 20 of the drain-side selection transistor STD is connected to the bit line BL above the drain-side selection gate SGD.

The source-side selection gate SGS functions as the gate electrode (the control gate) of the source-side selection transistor STS. An insulating film 52 (FIG. 2A) that functions as the gate insulator film of the source-side selection transistor STS is provided between the source-side selection gate SGS and the channel body 20. The channel body 20 of the source-side selection transistor STS is connected to the source line SL above the source-side selection gate SGS.

A back gate transistor BGT is provided in the connecting portion JP of the memory string MS. The back gate BG functions as the gate electrode (the control gate) of the back gate transistor BGT. The memory film 30 that is provided inside the back gate BG functions as the gate insulator film of the back gate transistor BGT.

The multiple memory cells that have the electrode layers WL of each layer as control gates are provided between the drain-side selection transistor STD and the back gate transistor BGT. Similarly, the multiple memory cells that have the electrode layers WL of each layer as control gates are provided also between the back gate transistor BGT and the source-side selection transistor STS.

The multiple memory cells, the drain-side selection transistor STD, the back gate transistor BGT, and the source-side selection transistor STS are connected in series via the channel body 20 and are included in one memory string MS having a U-shaped configuration. By the memory string MS being multiply arranged in the X-direction and the Y-direction, the multiple memory cells are provided three-dimensionally in the X-direction, the Y-direction, and the Z-direction.

According to the embodiment, the making of the hole for forming the columnar portion CL in the stacked body 100 is multiply divided as described below. First, after making a hole in the first stacked unit 11, a sacrificial film is filled into the hole. Subsequently, the second stacked unit 12 is stacked on the first stacked unit 11; and a hole is made in the second stacked unit 12. Thus, by making holes respectively in the stacked units 11 and 12 that divide the stacked body 100 into a plurality in the stacking direction, the increase of the aspect ratio (the ratio of the depth to the diameter) of each of the holes is suppressed; and the patterning is easy.

The first intermediate layer 13 is provided at the connection portion between the columnar portion CL inside the hole made in the first stacked unit 11 and the columnar portion CL inside the hole made in the second stacked unit 12.

Figure 2B:
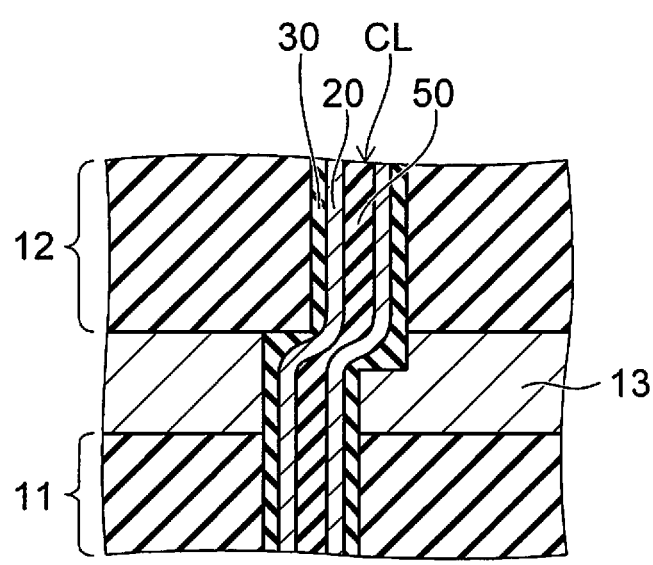

FIG. 2B is an enlarged schematic cross-sectional view of the connection portion.

There are cases where the central axis of the hole made in the first stacked unit 11 and the central axis of the hole made in the second stacked unit 12 do not match and are shifted in the Y-direction or the X-direction due to the alignment shift of the opening (the hole) patterns of the resist masks when making the holes respectively in the first stacked unit 11 and the second stacked unit 12, etc. For example, an example is shown in FIG. 2A in which the central axis of the hole made in the first stacked unit 11 and the central axis of the hole made in the second stacked unit 12 are shifted in the Y-direction.

In such a case, the central axis of the columnar portion CL formed in the first stacked unit 11 and the central axis of the columnar portion CL formed in the second stacked unit 12 also are shifted in the Y-direction. Accordingly, there are cases where a stepped portion is formed in the side wall of the portion of the columnar portion CL piercing the first intermediate layer 13.

Similarly, the making of the slit for forming the insulating separation films 61a and 61b is multiply divided as described below. First, after making a slit in the first stacked unit 11, the insulating separation film 61a is filled into the slit. Subsequently, the second stacked unit 12 is stacked on the first stacked unit 11; a slit is made in the second stacked unit 12; and the insulating separation film 61b is filled into the slit. Thus, the increase of the aspect ratio (the ratio of the depth to the width) of each of the slits is suppressed by making the slits respectively in the stacked units 11 and 12 that divide the stacked body 100 into a plurality in the stacking direction; and the patterning is easy.

The first intermediate layer 13 is provided at the connection portion between the insulating separation film 61a inside the slit made in the first stacked unit 11 and the insulating separation film 61b inside the slit made in the second stacked unit 12.

There are cases where the width-direction center position of the slit made in the first stacked unit 11 and the width-direction center position of the slit made in the second stacked unit 12 do not match and are shifted in the width direction (the Y-direction) due to the alignment shift of the opening (the slit) patterns of the resist masks when making the slits respectively in the first stacked unit 11 and the second stacked unit 12, etc.

In such a case, the center position in the width direction (the Y-direction) of the insulating separation film 61a formed in the first stacked unit 11 and the center position in the width direction (the Y-direction) of the insulating separation film 61b formed in the second stacked unit 12 also are shifted in the Y-direction as shown in FIG. 2A. Accordingly, there are cases where a stepped portion is formed in the side walls of the insulating separation films 61a and 61b at the portion where the insulating separation film 61a and the insulating separation film 61b connect at the first intermediate layer 13.

The first intermediate layer 13 is, for example, a tungsten silicide layer and is conductive. Similarly to the electrode layers WL, the first intermediate layer 13 also is provided around the channel body 20 with the memory film 30 interposed between the first intermediate layer 13 and the electrode layers WL. However, the programming of the data is not performed for the charge storage film 32 opposing the first intermediate layer 13; and the cells of the layer in which the first intermediate layer 13 is provided do not function as memory cells that store/retain data.

When programming data to the memory cells, a programming potential Vprog (e.g., about 20 V) is applied to the electrode layers WL of the memory cells to be programmed. A pass potential (or an intermediate potential) Vpass (e.g., about 10 V) that is lower than Vprog is applied to the electrode layers WL of the memory cells not to be programmed. Thereby, the electric field strength that is applied to the charge storage film 32 becomes strong only at the memory cells to be programmed.

In the data programming, Vpass which is the same as that of the electrode layers WL of the memory cells not to be programmed is applied to the first intermediate layer 13; and the data is not programmed to the charge storage film 32 opposing the first intermediate layer 13.

In the reading of the data, a potential Vread that is applied to the electrode layers WL of the memory cells to be read or a potential for passing the current through the channel body 20 opposing the first intermediate layer 13 is applied to the first intermediate layer 13.

A method for manufacturing the semiconductor memory device of the embodiment will now be described with reference to FIG. 4A to FIG. 12B and FIGS. 21A and 21B.

Figure 4A:
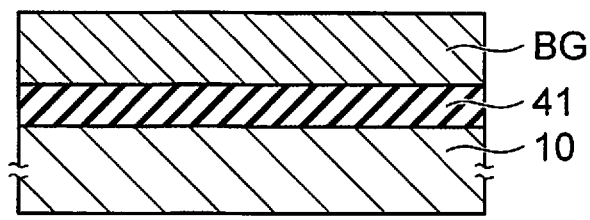
FIGS. 4A to 12B are schematic cross-sectional views showing a method for manufacturing a semiconductor memory device of the embodiment.
Figure 4B:
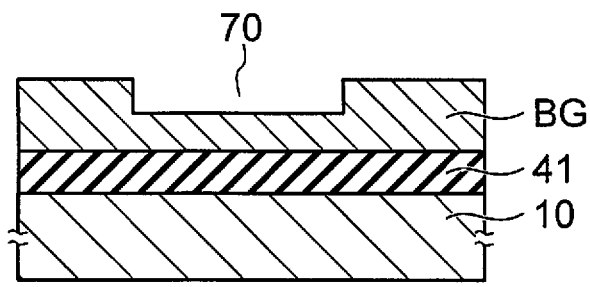
Figure 4C:
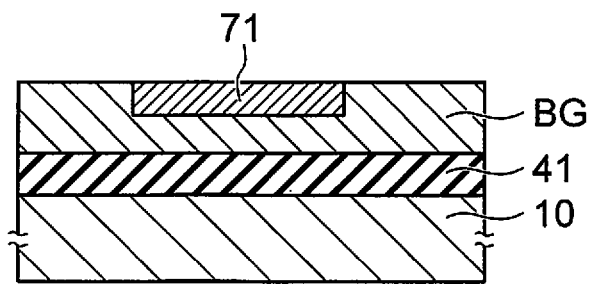

As shown in FIG. 4A, the back gate BG is formed on the substrate 10 with the insulating layer 41 interposed. A recess 70 is made in the back gate BG as shown in FIG. 4B. A sacrificial film 71 is filled into the recess 70 as shown in FIG. 4C; and the upper surface of the sacrificial film 71 is planarized by, for example, CMP (Chemical Mechanical Polishing). The sacrificial film 71 is, for example, a silicon nitride film.

Figure 4D:
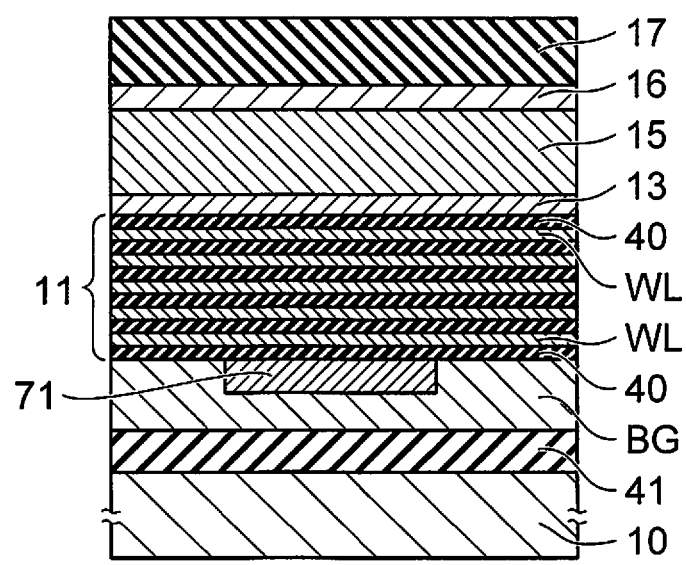

The electrode layer WL as a first layer and the insulating layer 40 as a second layer are multiply stacked alternately on the back gate BG and the sacrificial film 71 as shown in FIG. 4D. Accordingly, the first stacked unit 11 that includes the multiple layers of the electrode layers WL and the multiple layers of the insulating layers 40 is formed on the back gate BG and the sacrificial film 71.

The first intermediate layer 13 is formed on the first stacked unit 11. The uppermost layer of the first stacked unit 11 is, for example, the insulating layer 40; and the first intermediate layer 13 is formed on the insulating layer 40.

The first intermediate layer 13 is a material different from the electrode layers WL and the insulating layers 40 and is a layer that has etching resistance and has an etching rate for the conditions of the patterning by etching of the electrode layers WL and the insulating layers 40 that is lower than those of the electrode layers WL and the insulating layers 40. The first intermediate layer 13 is, for example, a tungsten silicide layer including tungsten silicide as a major component.

A mask film for patterning the first stacked unit 11 is formed on the first intermediate layer 13. The mask film includes a carbon film 15 that is formed on the first intermediate layer 13, a mask intermediate film (e.g., a silicon oxide film) 16 that is formed on the carbon film 15, and a resist film 17 that is formed on the mask intermediate film 16.

Figure 5A:
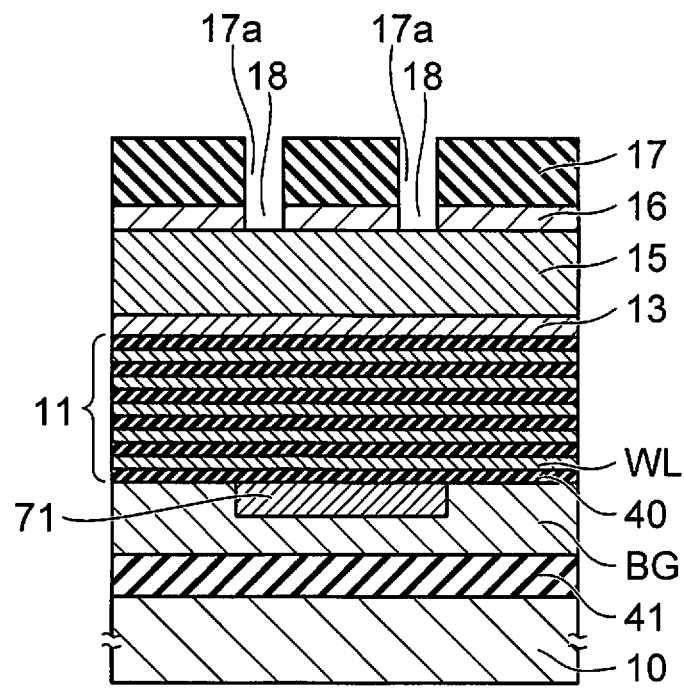

Holes 17a are made in the resist film 17 by exposing and developing as shown in FIG. 5A.

Using the resist film 17 in which the holes 17a are made as a mask, holes 18 are made in the mask intermediate film 16 by, for example, patterning the mask intermediate film (the silicon oxide film) 16 by RIE (Reactive Ion Etching) using a gas including fluorine.

Figure 5B:
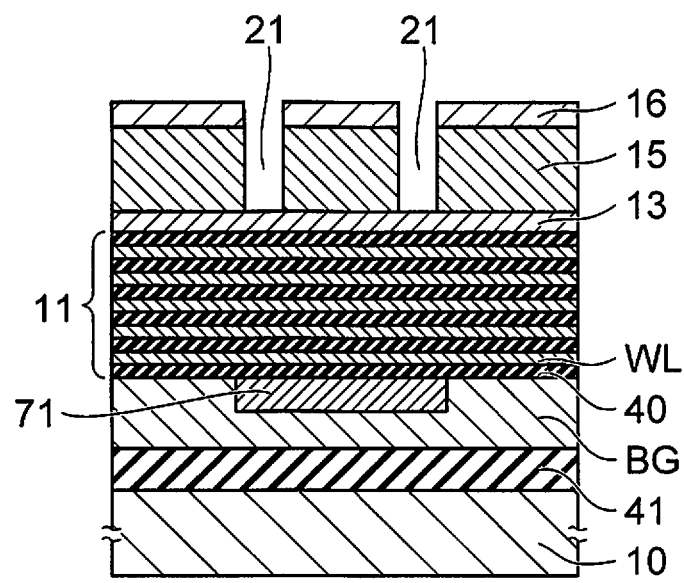

Continuing, using the mask intermediate film 16 in which the holes 18 are made as a mask, the carbon film 15 is patterned by, for example, RIE using a gas including oxygen. Holes 21 are made in the carbon film 15 as shown in FIG. 5B.

In the patterning of the carbon film 15, the resist film 17 that includes carbon, as a major component also is etched; and the resist film 17 vanishes in the initial patterning of the carbon film 15. Accordingly, the mask intermediate film 16 (the silicon oxide film) functions as a mask in the patterning of the carbon film 15.

Then, using the carbon film 15 in which the holes 21 are made as a mask, the first intermediate layer (the tungsten silicide layer) 13 is patterned by, for example, RIE using a gas mixture including $NF_3$ and $Cl_2$.

Figure 6A:
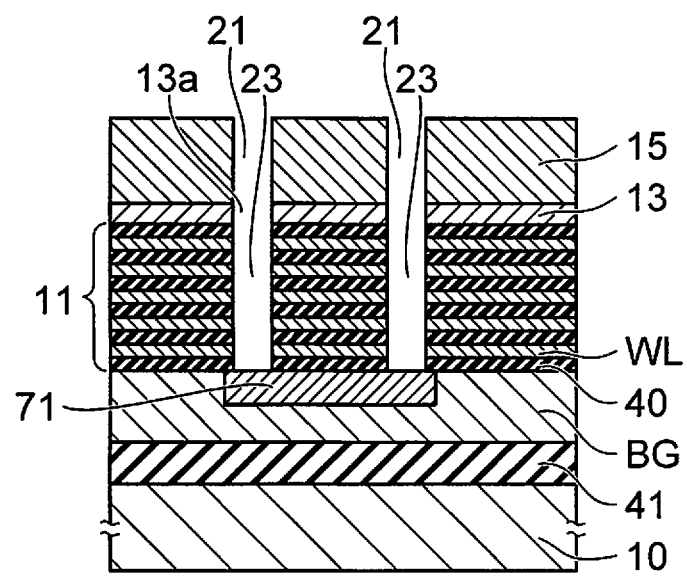

Thereby, as shown in FIG. 6A, first mask holes 13a are made in the first intermediate layer 13.

Continuing, the first stacked unit 11 that is under the first mask holes 13a is patterned by RIE using the carbon film 15 as a mask.

Unselective etching of the insulating layers (the silicon oxide layers) 40 and the electrode layers (the silicon layers) WL of the first stacked unit 11 is performed using the same gas. For example, continuous etching of the insulating layers 40 and the electrode layers WL is performed using a gas mixture including $O_2$, HBr, and a fluorocarbon such as $CHF_3$, etc.

Thereby, as shown in FIG. 6A, first holes 23 are made in the first stacked unit 11. The lower ends (the bottoms) of the first holes 23 reach the sacrificial film 71 filled into the back gate BG. The sacrificial film 71 that is made of a material (e.g., silicon nitride) different from the insulating layers 40 and the electrode layers WL functions as an etching stopper when making the first holes 23. A pair of the first holes 23 reaches a common sacrificial film 71.

The carbon film 15 that remains on the first intermediate layer 13 is removed by, for example, ashing.

Figure 6B:
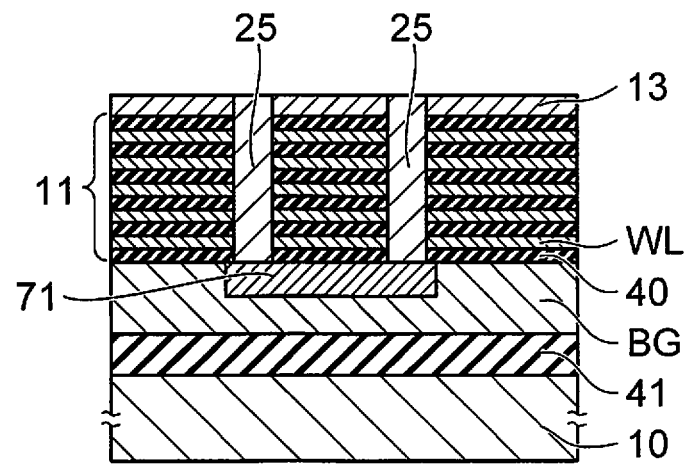

As shown in FIG. 6B, a sacrificial film 25 is filled into the first holes 23. The sacrificial film 25 is filled also into the first mask holes 13a of the first intermediate layer 13. The upper surface of the sacrificial film 25 is planarized by, for example, CMP. The sacrificial film 25 is made of a material different from the electrode layers WL and the insulating layers 40, e.g., a silicon nitride film.

Figure 7A:
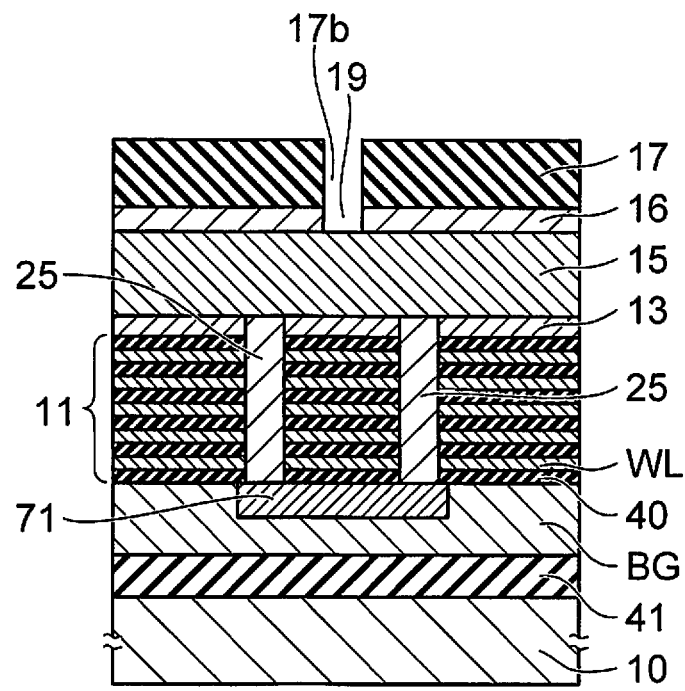

After forming the sacrificial film 25, a mask film is formed as shown in FIG. 7A. The mask film is the same as when the first holes 23 were made and includes the carbon film 15 that is formed on the first intermediate layer 13, the mask intermediate film 16 that is formed on the carbon film 15, and the resist film 17 that is formed on the mask intermediate film 16.

As shown in FIG. 7A, a slit 17b is made in the resist film 17 by exposing and developing.

Using the resist film 17 in which the slit 17b is made as a mask, a slit 19 is made in the mask intermediate film 16 by, for example, patterning the mask intermediate film (the silicon oxide film) 16 by RIE using a gas including fluorine.

Figure 7B:
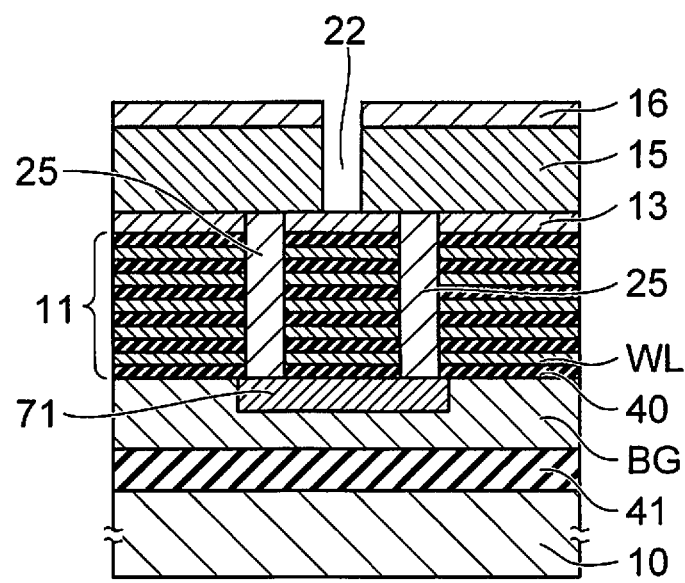

Continuing, using the mask intermediate film 16 in which the slit 19 is made as a mask, the carbon film 15 is patterned by, for example, RIE using a gas including oxygen. As shown in FIG. 7B, a slit 22 is made in the carbon film 15.

In the patterning of the carbon film 15, the resist film 17 that includes carbon as a major component also is etched; and the resist film 17 vanishes in the initial patterning of the carbon film 15. Accordingly, the mask intermediate film 16 (the silicon oxide film) functions as a mask in the patterning of the carbon film 15.

Then, using the carbon film 15 in which the slit 22 is made as a mask, the first intermediate layer (the tungsten silicide layer) 13 is patterned by, for example, RIE using a gas mixture including $NF_3$ and $Cl_2$.

Figure 8A:
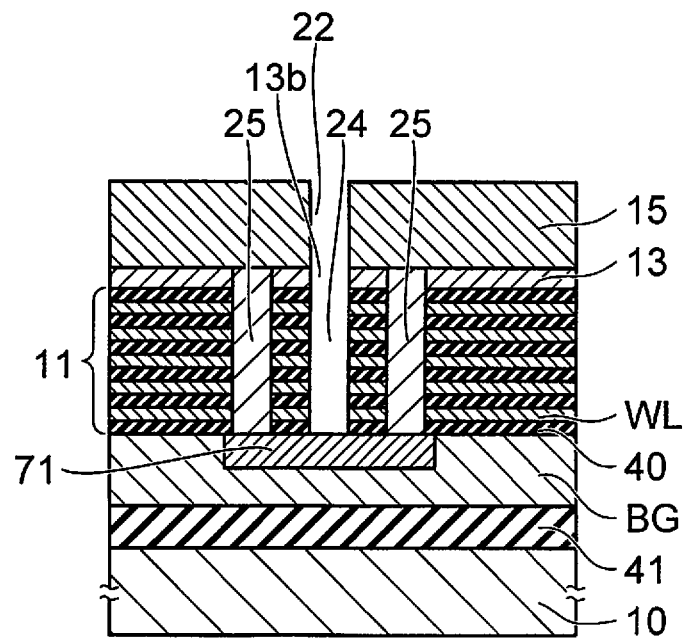

Thereby, a first mask slit 13b is made in the first intermediate layer 13 as shown in FIG. 8A.

Continuing, using the carbon film 15 as a mask, the first stacked unit 11 under the first mask slit 13b is patterned by RIE.

Unselective etching of the insulating layers (the silicon oxide layers) 40 and the electrode layers (the silicon layers) WL of the first stacked unit 11 is performed using the same gas. For example, continuous etching of the insulating layers 40 and the electrode layers WL is performed using a gas mixture including $O_2$, HBr, and a fluorocarbon such as $CHF_3$, etc.

Thereby, a first slit 24 is made in the first stacked unit 11 as shown in FIG. 8A. The lower end (the bottom) of the first slit 24 reaches the sacrificial film 71 filled into the back gate BG. The first slit 24 is made between a pair of the first holes 23, extends in a direction piercing the page surface, and divides the first stacked unit 11.

The sacrificial film 71 that is made of a material (e.g., silicon nitride) different from the insulating layers 40 and the electrode layers WL functions as an etching stopper when making the first slit 24.

The carbon film 15 that remains on the first intermediate layer 13 is removed by, for example, ashing.

Figure 8B:
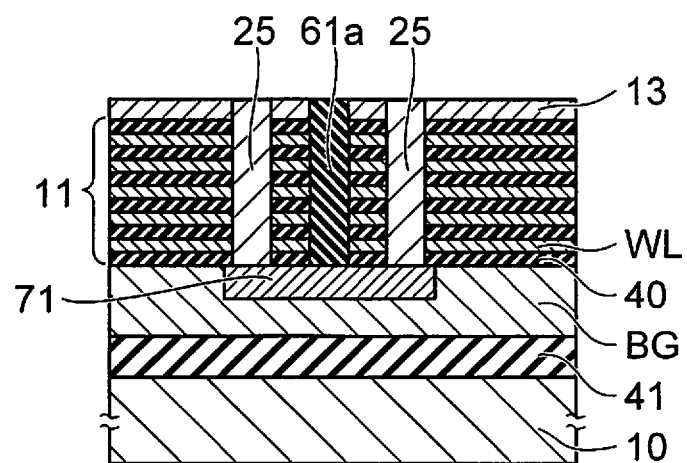

As shown in FIG. 8B, the first insulating separation film 61a is filled into the first slit 24. The first insulating separation film 61a is filled also into the first mask slit 13b of the first intermediate layer 13. The upper surface of the first insulating separation film 61a is planarized by, for example, CMP. The first insulating separation film 61a is made of a material different from the sacrificial film 71, e.g., a silicon oxide film.

Figure 9A:
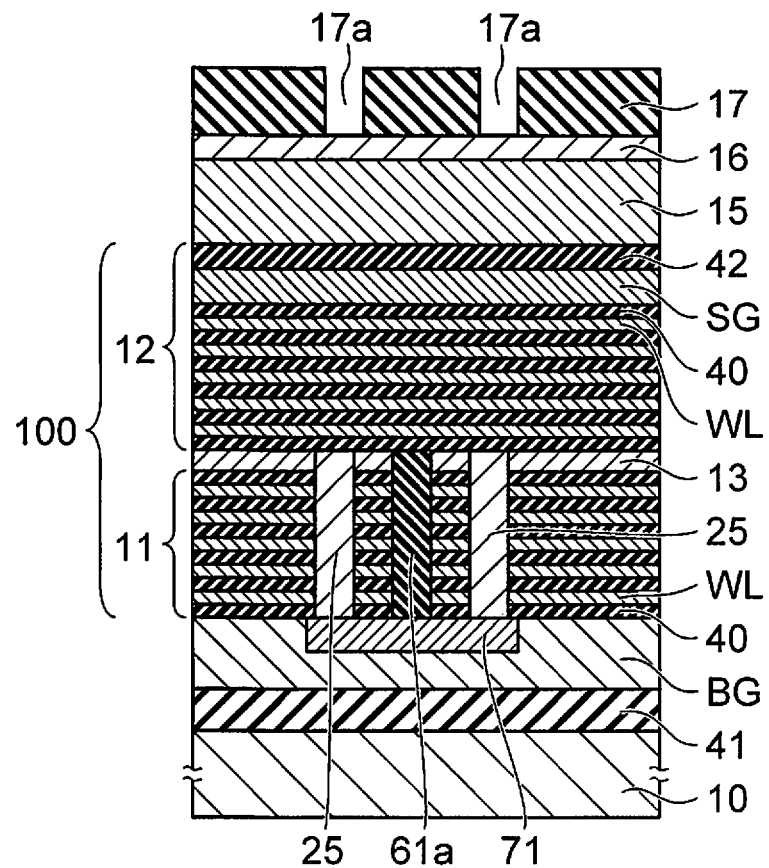

Then, as shown in FIG. 9A, the second stacked unit 12 that includes the multiple layers of the electrode layers WL and the multiple layers of the insulating layers 40 is formed on the first intermediate layer 13. In other words, the electrode layer WL as the first layer of the second stacked unit 12 and the insulating layer 40 as the second layer of the second stacked unit 12 are multiply stacked alternately on the first intermediate layer 13. For example, the insulating layer 40 is formed directly on the first intermediate layer 13.

Also, the process of forming the second stacked unit 12 includes the process of forming an upper gate layer SG on the electrode layer WL of the uppermost layer with the insulating layer 40 interposed and the process of forming the insulating layer 42 on the upper gate layer SG. The upper gate layer SG is made of the same type of material as the electrode layers WL, e.g., a silicon layer; and the insulating layer 42 is made of the same type of material as the insulating layers 40, e.g., a silicon oxide layer.

A mask film that is similar to that when patterning the first stacked unit 11 is formed on the second stacked unit 12. In other words, the carbon film 15 is formed on the second stacked unit 12; the mask intermediate film (e.g., the silicon oxide film) 16 is formed on the carbon film 15; and the resist film 17 is formed on the mask intermediate film 16.

As shown in FIG. 9A, the holes 17a are made in the resist film 17 by exposing and developing.

Figure 9B:
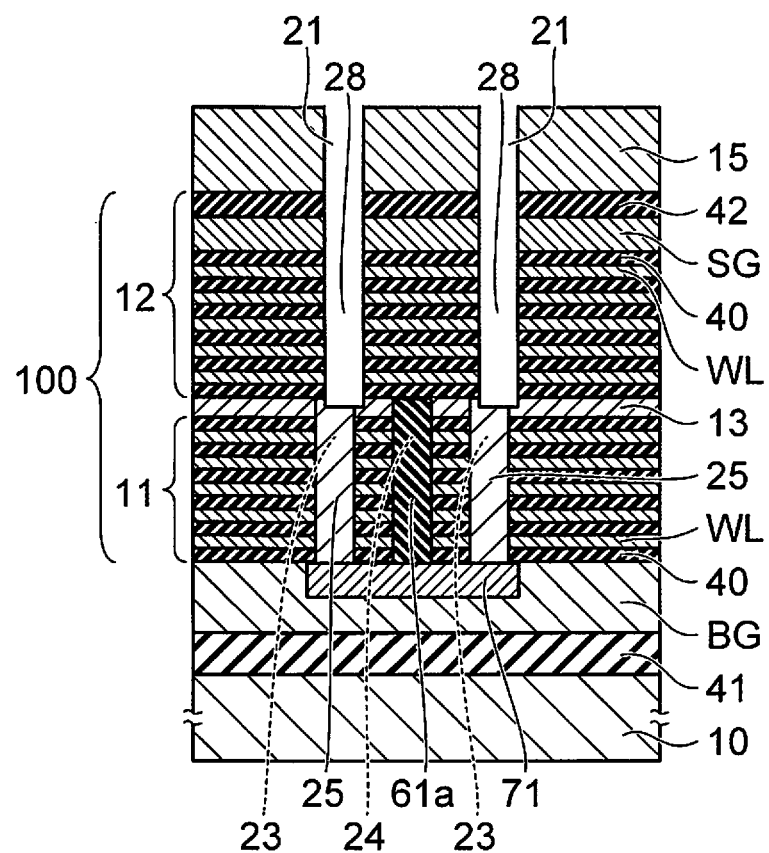

Using the resist film 17 in which the holes 17a are made as a mask, holes are made in the mask intermediate film 16 by, for example, patterning the mask intermediate film 16 by RIE using a gas including fluorine. Continuing, using the mask intermediate film 16 in which the holes are made as a mask, the carbon film 15 is patterned by, for example, RIE using a gas including oxygen. As shown in FIG. 9B, the holes 21 are made in the carbon film 15.

Then, the second stacked unit 12 is patterned by RIE using the carbon film 15 in which the holes 21 are made as a mask.

For example, for the second stacked unit 12, unselective etching of the first layers (the electrode layers WL and the upper gate layer SG) which are silicon layers and the second layers (the insulating layers 40 and 42) which are silicon oxide layers is performed using the same gas.

For example, continuous etching of the first layers (the electrode layers WL and the upper gate layer SG) and the second layer (the insulating layers 40 and 42) is performed using a gas mixture (an etching gas) including $O_2$, HBr, and a fluorocarbon such as $CHF_3$, etc.

Thereby, second holes 28 are made in the second stacked unit 12 as shown in FIG. 9B.

The lower ends (the bottoms) of the second holes 28 reach the sacrificial film 25. A film of the same material as the sacrificial film 25 is filled into the second holes 28 as described below. Accordingly, the sacrificial film 25 may be etched somewhat in the etching that makes the second holes 28.

There are cases where the central axes of the second holes 28 are shifted with respect to the central axes of the first holes 23 (FIG. 6A) due to the alignment shift between the mask pattern when patterning the first stacked unit 11 and the mask pattern when patterning the second stacked unit 12.

Figure 21A:
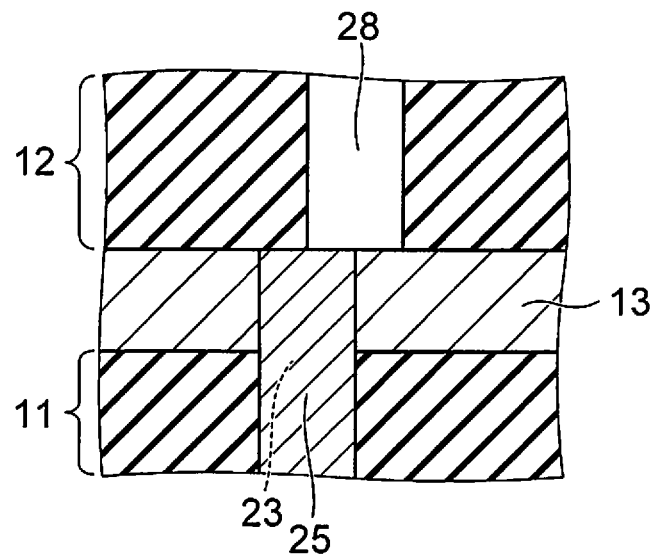
Figure 21B:
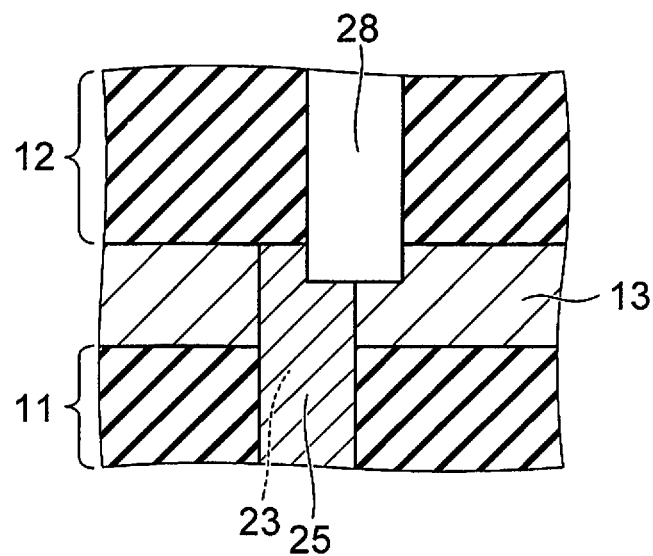

In such a case, as shown in FIG. 9B and FIG. 21B, portions of the lower ends (the bottoms) of the second holes 28 jut in the diametral direction from the sacrificial film 25 to reach the first intermediate layer 13.

FIG. 21B is an enlarged cross-sectional view of the portion of the second hole 28 that reaches the sacrificial film 25 and the first intermediate layer 13.

Both the sacrificial film (e.g., the silicon nitride film) 25 and the first intermediate layer (e.g., the tungsten silicide layer) 13 are made of materials different from the first layers and the second layers and have etching rates in the patterning of the second stacked unit 12 that are lower than that of the second stacked unit 12 (the first layers and the second layers).

In other words, the first intermediate layer 13 has etching resistance to the etching gas when making the second hole 28 and functions as an etching stopper in the etching.

Also, when the second hole 28 reaches the first intermediate layer 13 and the first intermediate layer 13 is etched, the reaction products (the tungsten carbide) from the tungsten that is included in the first intermediate layer 13 and the carbon inside the etching gas are produced at the surface of the first intermediate layer 13 that is exposed in the second hole 28. Tungsten carbide has more etching resistance to the etching gas recited above than does tungsten silicide. Also, the reaction products of the tungsten and the bromine inside the etching gas have a low vapor pressure; and the tungsten is not patterned easily by the bromine.

Accordingly, a high etching selectivity (the ratio of the etching rate of the second stacked unit 12 to the etching rate of the first intermediate layer 13) is obtained when making the second hole 28.

When the second hole 28 pierces the first intermediate layer 13 and reaches the first stacked unit 11, a portion having a large diameter is made partially in the hole (the columnar portion CL) of the first stacked unit 11; and there is a risk of characteristic fluctuation of the memory cell at the portion.

Conversely, according to the embodiment, even in the case where the etching of the second hole 28 progresses so that the central axis is shifted from the first hole 23 (the sacrificial film 25) made in the first stacked unit 11, the second hole 28 can be prevented from reaching the first stacked unit 11 without the first intermediate layer 13 being etched excessively. Accordingly, the characteristic fluctuation between the memory cells in the stacking direction can be suppressed by suppressing the fluctuation of the configuration and dimensions of the columnar portion CL of the first stacked unit 11.

Further, according to the embodiment, because the holes are made respectively in the stacked units 11 and 12 that divide the entire stacked body 100 into multiple layers in the stacking direction, the patterning aspect ratio is lower than in the case where a hole is made once in the stacked body 100. Therefore, holes that have excellent configuration and dimensional controllability can be made respectively in the stacked units 11 and 12. As a result, the fluctuation of the memory cell characteristics in the stacking direction can be suppressed by suppressing the fluctuation of the diameter of the columnar portion CL formed in the stacked body 100.

In the case where the etching of the second hole 28 progresses so that the position is shifted from the first hole 23 (the sacrificial film 25) and the etching is stopped at the point in time when the bottom of the second hole 28 reaches the upper surface of the first intermediate layer 13 as shown in FIG. 21A, the region where the first hole 23 and the second hole 28 overlap is undesirably narrow in the case where the first hole 23 (the sacrificial film 25) and the second hole 28 are greatly shifted.

In other words, the diameter of the connection portion between the first hole 23 (the sacrificial film 25) and the second hole 28 undesirably becomes smaller than the original diameters of the holes 23 and 28. In the case where the holes 23 and 28 have a constricted portion, there is a risk that the holes may be plugged at the constricted portion in the film formation of the memory film 30 and/or the channel body 20; and the film formation on the inner wall of the hole 23 of the first stacked unit 11 that is lower than the constricted portion may no longer be possible.

Therefore, as shown in FIG. 21B, it is desirable to perform slight over-etching of the first intermediate layer 13 in the etching that makes the second hole 28. The diameter of the connection portion between the second hole 28 and the first hole 23 (the sacrificial film 25) can be increased by the amount of the width of the region where the first intermediate layer 13 is etched.

As described above, because the cells positioned in the layer of the first intermediate layer 13 are not used as memory cells, the diameter of the columnar portion CL in the first intermediate layer 13 may be somewhat large.

Also, it is possible for the first intermediate layer 13 to be a thinner film because the first intermediate layer 13 has a high resistance to the etching in the making of the second hole 28. Thereby, the increase of the stacking height of the entire stacked body 100 is suppressed; and the degree of difficulty of processes such as the removal of the sacrificial films 25 and 71, the film formation of the memory film 30 inside the holes, the film formation of the channel body 20, etc., described below is not increased.

The first intermediate layer 13 is not limited to a tungsten silicide layer and may be a tungsten layer. In the case where SH processing using, for example, a mixed liquid of sulfuric acid and hydrogen peroxide is performed via the holes in a subsequent process, it is desirable for tungsten silicide which has a resistance to the SH processing that is higher than that of tungsten to be used as the first intermediate layer 13.

Also, a metal silicide layer that includes molybdenum silicide, cobalt silicide, and nickel silicide can be used as the first intermediate layer 13. Also, a layer that includes molybdenum, titanium, a metal having a vapor pressure lower than that of the compound of fluorine and bromine included in the etching gas, and carbides and/or nitrides of the metal can be used as the first intermediate layer 13.

The carbon film 15 that remains on the second stacked unit 12 is removed by, for example, ashing.

Figure 10A:
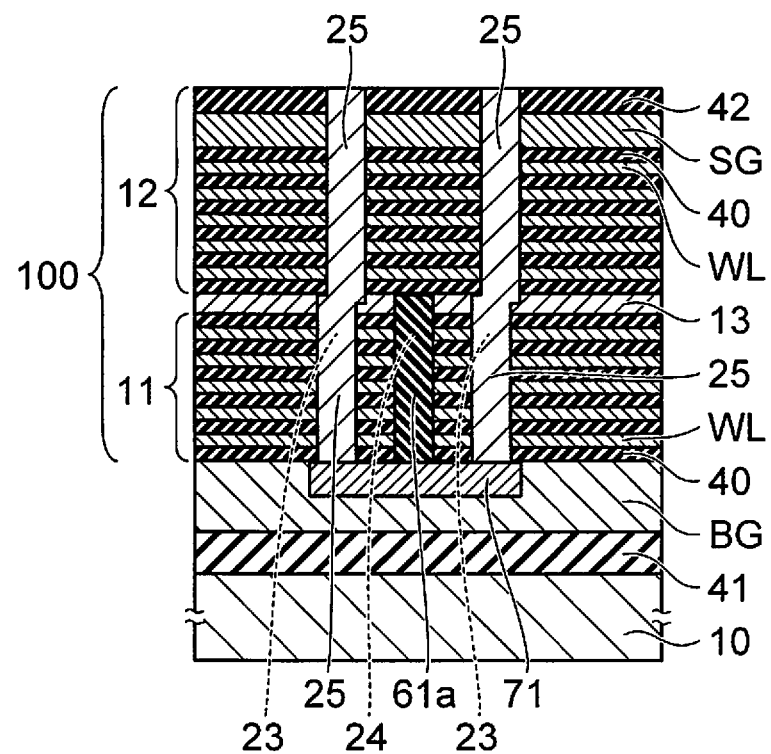

As shown in FIG. 10A, a silicon nitride film is filled into the second hole 28 as the sacrificial film 25. Accordingly, the silicon nitride film is filled as a single body as the sacrificial film 25 inside the first hole 23 of the first stacked unit 11 and inside the second hole 28 of the second stacked unit 12.

Figure 10B:
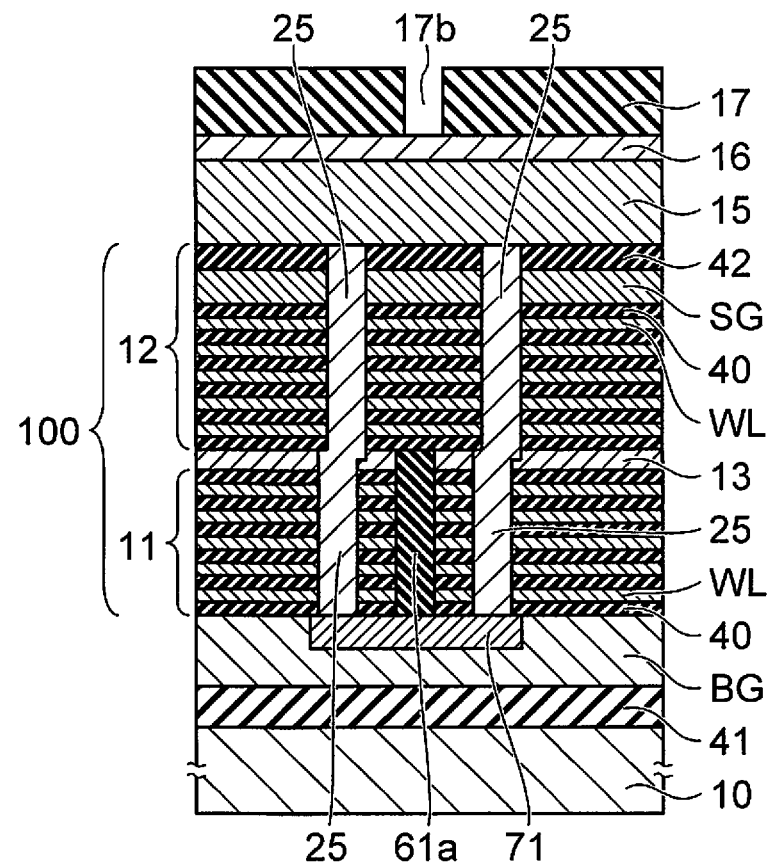

Then, a mask film that is similar to that of the patterning recited above is formed on the second stacked unit 12. In other words, as shown in FIG. 10B, the carbon film 15 is formed on the second stacked unit 12; the mask intermediate film (e.g., the silicon oxide film) 16 is formed on the carbon film 15; and the resist film 17 is formed on the mask intermediate film 16.

The slit 17b is made in the resist film 17 by exposing and developing.

Figure 11A:
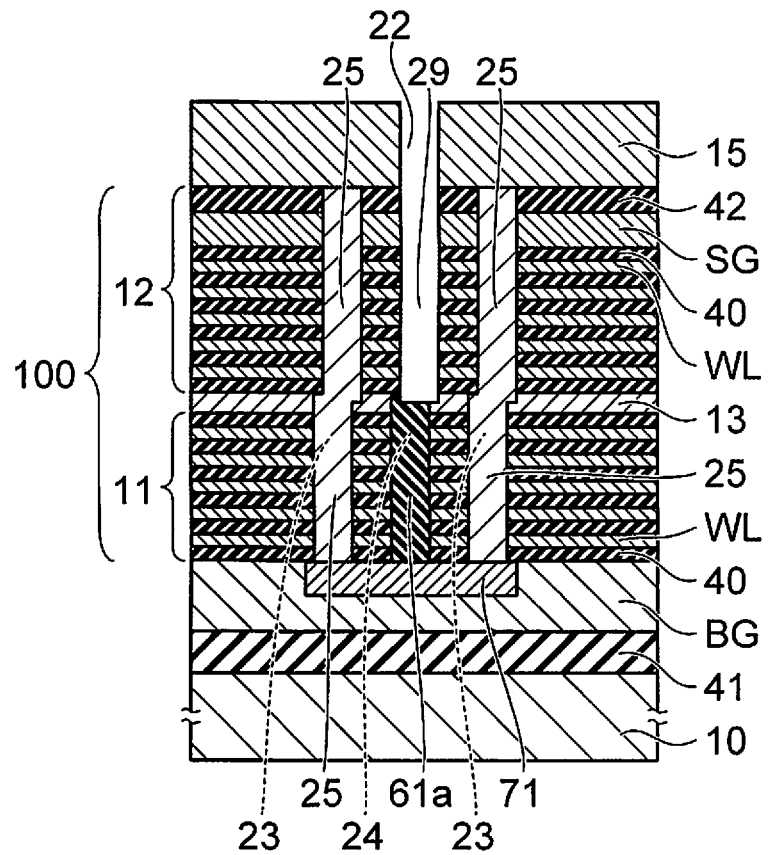

Using the resist film 17 in which the slit 17b is made as a mask, a slit is made in the mask intermediate film 16 by, for example, patterning the mask intermediate film 16 by RIE using a gas including fluorine. Continuing, using the mask intermediate film 16 in which the slit is made as a mask, the carbon film 15 is patterned by, for example, RIE using a gas including oxygen. The slit 22 is made in the carbon film 15 as shown in FIG. 11A.

Then, using the carbon film 15 in which the slit 22 is made as a mask, the second stacked unit 12 is patterned by RIE.

For the second stacked unit 12, for example, unselective etching of the first layers (the electrode layers WL and the upper gate layer SG) which are silicon layers and the second layers (the insulating layers 40 and 42) which are silicon oxide layers is performed using the same gas.

For example, continuous etching of the first layers (the electrode layers WL. and the upper gate layer SG) and the second layers (the insulating layers 40 and 42) is performed using a gas mixture (an etching gas) including $O_2$, HBr, and a fluorocarbon such as $CHF_3$, etc.

Thereby, as shown in FIG. 11A, a second slit 29 is made in the second stacked unit 12. The lower end (the bottom) of the second slit 29 reaches the first insulating separation film 61a. The second slit 29 extends in a direction piercing the page surface between a pair of sacrificial films 25 having columnar configurations to divide the second stacked unit 12.

As described below, a film of the same material as the first insulating separation film 61a is filled into the second slit 29. Accordingly, the first insulating separation film 61a may be etched somewhat in the etching that makes the second slit 29.

There are cases where the center (the width-direction center) of the second slit 29 is shifted from the center (the width-direction center) of the first slit 24 (FIG. 8A) due to the alignment shift between the mask pattern when patterning the first stacked unit 11 and the mask pattern when patterning the second stacked unit 12.

In such a case, as shown in FIG. 11A, a portion of the lower end (the bottom) of the second slit 29 juts in the width direction from the first insulating separation film 61a to reach the first intermediate layer 13.

The first intermediate layer (e.g., the tungsten silicide layer) 13 is made of a material different from the first layers and the second layers and has an etching rate in the patterning of the second stacked unit 12 that is lower than that of the second stacked unit 12 (the first layers and the second layers).

In other words, the first intermediate layer 13 has etching resistance to the etching gas when making the second slit 29 and functions as an etching stopper in the etching.

Also, when the second slit 29 reaches the first intermediate layer 13 and the first intermediate layer 13 is etched, the reaction products (the tungsten carbide) of the tungsten included in the first intermediate layer 13 and the carbon inside the etching gas are produced at the surface of the first intermediate layer 13 that is exposed in the second slit 29. The tungsten carbide has a higher etching resistance to the etching gas recited above than does the tungsten silicide. Also, the vapor pressure of the reaction products of the tungsten and the bromine inside the etching gas is low; and the tungsten is not patterned easily by the bromine.

Accordingly, a high etching selectivity (the ratio of the etching rate of the second stacked unit 12 to the etching rate of the first intermediate layer 13) is obtained when making the second slit 29.

When the second slit 29 pierces the first intermediate layer 13 and reaches the first stacked unit 11, a portion having a large width is formed partially in the first insulating separation film 61a of the first stacked unit 11; the width of the electrode layer WL between the portion and the columnar portion CL is partially narrow; and there is a risk that the characteristic fluctuation of the memory cells at the portion may occur.

Conversely, according to the embodiment, even in the case where the etching of the second slit 29 progresses so that the width-direction center is shifted from the first slit 24 (the first insulating separation film 61a) made in the first stacked unit 11, the second slit 29 can be prevented from reaching the first stacked unit 11 without the first intermediate layer 13 being etched excessively. Therefore, the fluctuation in the stacking direction of the distance between the first insulating separation film 61a and the columnar portion CL in the first stacked unit 11 can be suppressed; and as a result, the fluctuation of the characteristics of the memory cells in the stacking direction can be suppressed.

Also, the patterning aspect ratio is lower than in the case where the slit is made once in the stacked body 100 because slits are made respectively in the stacked units 11 and 12 that divide the entire stacked body 100 into multiple layers in the stacking direction. Therefore, slits that have excellent configuration and dimensional controllability can be made respectively in the stacked units 11 and 12.

The carbon film 15 that remains on the second stacked unit 12 is removed by, for example, ashing.

Figure 11B:
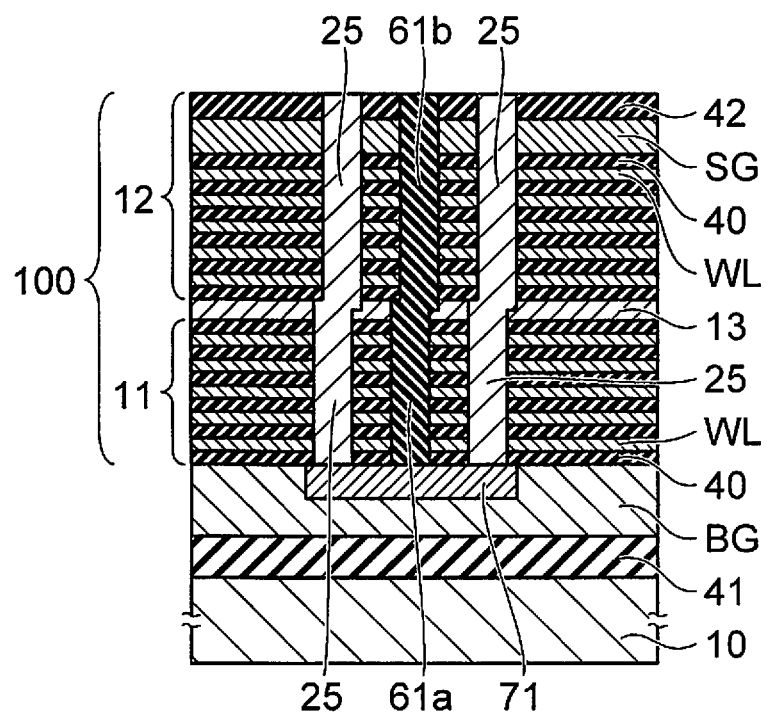

As shown in FIG. 11B, the second insulating separation film 61b is filled into the second slit 29. The second insulating separation film 61b is made of a material different from the sacrificial films 71 and 25, e.g., a silicon oxide film.

Then, the sacrificial film (the silicon nitride film) 25 is removed. At this time, the insulating layer 42 of the uppermost layer which is, for example, a silicon oxide film is used as an etching mask.

Figure 12A:
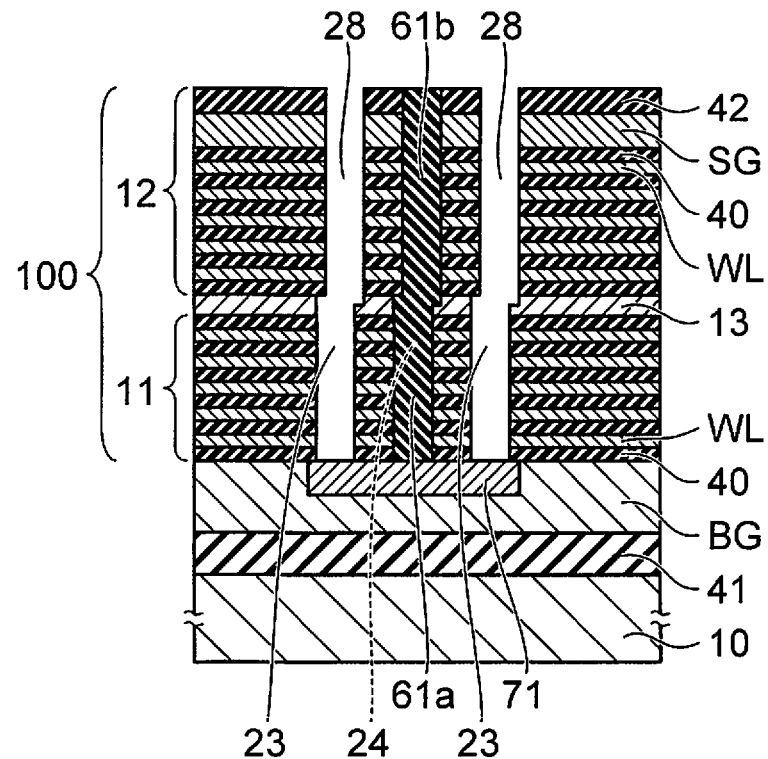

By the removal of the sacrificial film 25 as shown in FIG. 12A, the first hole 23 that is made in the first stacked unit 11 and the second hole 28 that is made in the second stacked unit 12 appear. The first hole 23 and the second hole 28 are connected in the stacking direction.

Continuing, the sacrificial film 71 that is filled into the back gate BG is removed via the first hole 23 and the second hole 28.

The sacrificial film 25 and the sacrificial film 71 are silicon nitride films and can be removed by, for example, hot phosphoric acid. At this time, the insulating separation films 61a and 61b which are silicon oxide films are not removed.

Figure 12B:
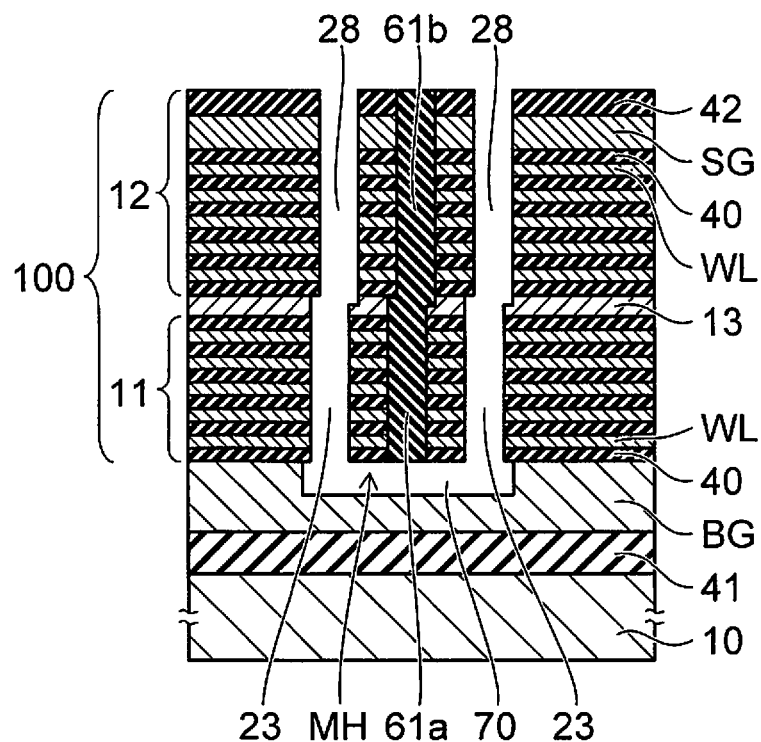

By the removal of the sacrificial film 71 as shown in FIG. 12B, the recess 70 that is made in the back gate BG appears; and the lower end of the first hole 23 is connected to the recess 70. Accordingly, the recess 70, a pair of the first holes 23, and a pair of the second holes 28 are connected; and a memory hole MH having a U-shaped configuration is made.

After making the memory hole MH, each of the films shown in FIG. 2A are formed in order on the inner wall of the memory hole MH. In other words, the memory film 30, the channel body 20, and the core insulating film 50 (FIG. 3) are formed inside the memory hole MH.

Figure 13A:
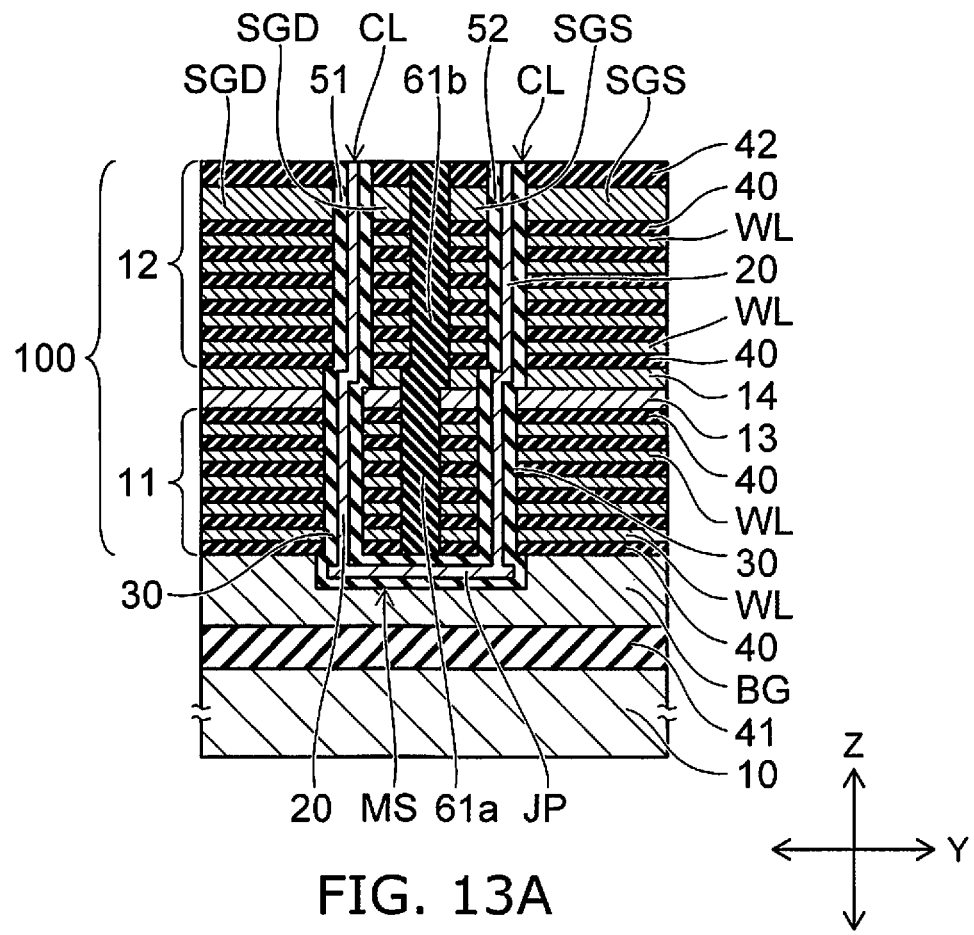
FIGS. 13A and 13B are schematic cross-sectional views of a memory string of the embodiment.

FIG. 13A is a schematic cross-sectional view of the memory string MS of another embodiment and corresponds to a cross section parallel to the YZ plane of FIG. 1 similarly to FIG. 2A.

According to the embodiment of FIG. 13A, a second intermediate layer 14 is further provided between the first intermediate layer 13 and the second stacked unit 12. Otherwise, the configuration is the same as that of the embodiment shown in FIG. 2A.

Figure 13B:
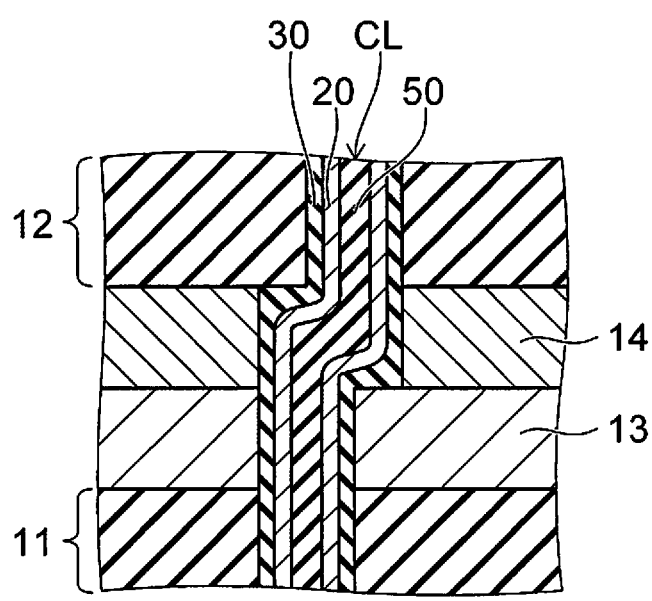

FIG. 13B is an enlarged schematic cross-sectional view of a portion of the columnar portion CL piercing the first intermediate layer 13 and the second intermediate layer 14.

The second intermediate layer 14 is stacked on the first intermediate layer 13 to contact the first intermediate layer 13. The insulating layer 40 is provided between the second intermediate layer 14 and the electrode layer WL of the lowermost layer of the second stacked unit 12.

The second intermediate layer 14 is a layer of a material different from the first intermediate layer 13, is a layer of the same type of material as the electrode layers WL or the insulating layers 40, and in the embodiment shown in FIG. 13A, is, for example, a layer (a conductive silicon layer including an impurity) of the same type of material as the electrode layers WL.

In the etching that makes the second hole 28 and the second slit 29 in the second stacked unit 12, the etching rate of the second intermediate layer 14 is higher than that of the first intermediate layer 13.

In the embodiment shown in FIG. 13A as well, the making of the hole for forming the columnar portion CL in the stacked body 100 is multiply divided as described below. First, after making a hole in the first stacked unit 11, a sacrificial film is filled into the hole. Subsequently, the second stacked unit 12 is stacked on the first stacked unit 11; and a hole is made in the second stacked unit 12. Thus, the increase of the aspect ratio (the ratio of the depth to the diameter) of each of the holes is suppressed by making the holes respectively in the stacked units 11 and 12 that divide the stacked body 100 into a plurality in the stacking direction; and the patterning is easy.

The first intermediate layer 13 and the second intermediate layer 14 are provided at the connection portion between the columnar portion CL inside the hole made in the first stacked unit 11 and the columnar portion CL inside the hole made in the second stacked unit 12.

There are cases where the central axis of the hole made in the first stacked unit 11 and the central axis of the hole made in the second stacked unit 12 do not match and are shifted in the Y-direction or the X-direction due to the alignment shift of the opening (the hole) patterns of the resist masks when making the holes respectively in the first stacked unit 11 and the second stacked unit 12, etc. For example, FIGS. 13A and 13B show an example in which the central axis of the hole made in the first stacked unit 11 and the central axis of the hole made in the second stacked unit 12 are shifted in the Y-direction.

In such a case, the central axis of the columnar portion CL formed in the first stacked unit 11 and the central axis of the columnar portion CL formed in the second stacked unit 12 also are shifted in the Y-direction. Because of the alignment shift, according to the embodiment shown in FIGS. 13A and 13B, a stepped portion is formed in the side wall of the columnar portion CL at the portion piercing the second intermediate layer 14.

Also, the diameter of the portion of the columnar portion CL piercing the second intermediate layer 14 is larger than the diameter of the portion of the columnar portion CL piercing the stacked body (the first intermediate layer 13 and the first stacked unit 11) lower than the second intermediate layer 14. Further, the diameter of the portion of the columnar portion CL piercing the second intermediate layer 14 is larger than the diameter of the portion of the columnar portion CL piercing the second stacked unit 12 higher than the second intermediate layer 14.

Similarly, the making of the slit for forming the insulating separation films 61a and 61b is multiply divided as described below. First, after making a slit in the first stacked unit 11, the insulating separation film 61a is filled into the slit. Subsequently, the second stacked unit 12 is stacked on the first stacked unit 11; a slit is made in the second stacked unit 12; and the insulating separation film 61b is filled into the slit. Thus, the increase of the aspect ratio (the ratio of the depth to the width) of each of the slits is suppressed by making the slits respectively in the stacked units 11 and 12 that divide the stacked body 100 into a plurality in the stacking direction; and the patterning is easy.

The first intermediate layer 13 and the second intermediate layer 14 are provided at the connection portion between the insulating separation film 61a inside the slit made in the first stacked unit 11 and the insulating separation film 61b inside the slit made in the second stacked unit 12.

There are cases where the width-direction center position of the slit made in the first stacked unit 11 and the width-direction center position of the slit made in the second stacked unit 12 do not match and are shifted in the width direction (the Y-direction) due to the alignment shift of the opening (the slit) patterns of the resist masks when making the slits respectively in the first stacked unit 11 and the second stacked unit 12, etc.

In such a case, the center position in the width direction (the Y-direction) of the insulating separation film 61a formed in the first stacked unit 11 and the center position in the width direction (the Y-direction) of the insulating separation film 61b formed in the second stacked unit 12 also are shifted in the Y-direction. According to the embodiment of FIG. 13A, a stepped portion is formed in the side walls of the insulating separation films 61a and 61b at the portion where the insulating separation film 61a and the insulating separation film 61b connect at the second intermediate layer 14.

Also, the width of the portion where the first insulating separation film 61a and the second insulating separation film 61b connect at the second intermediate layer 14 is greater than the width of the portion of the first insulating separation film 61a piercing the first stacked unit 11 and the width of the portion of the second insulating separation film 61b piercing the second stacked unit 12.

The second intermediate layer 14 is, for example, the same conductive silicon layer as the electrode layers WL. Similarly to the electrode layers WL, the second intermediate layer 14 also is provided around the channel body 20 with the memory film 30 interposed. However, similarly to the first intermediate layer 13, the programming of data is not performed for the charge storage film 32 opposing the second intermediate layer 14; and the cells of the layer in which the second intermediate layer 14 is provided do not function as memory cells that store/retain data.

Accordingly, in the data programming, the same Vpass as that of the electrode layers WL of the memory cells not to be programmed is applied to the second intermediate layer 14; and data is not programmed to the charge storage film 32 opposing the second intermediate layer 14.

In the reading of the data, the potential Vread that is applied to the electrode layers WL of the memory cells to be read or the potential for passing the current through the channel body 20 opposing the second intermediate layer 14 is applied to the second intermediate layer 14.

A layer of the same type as the insulating layers 40, i.e., an insulating layer, may be used as the second intermediate layer 14. In such a case, if the thickness of the second intermediate layer 14 is set to be thin so that the fringe electric field from the electrode layers WL above and below the second intermediate layer 14 affects the channel body 20 opposed by the second intermediate layer 14, the current can be passed through the channel body 20 opposed by the second intermediate layer 14 even in the case where the second intermediate layer 14 is an insulating layer.

A method for manufacturing the semiconductor memory device of the embodiment shown in FIG. 13A will now be described with reference to FIG. 14A to FIG. 20B and FIG. 21C.

Figure 14A:
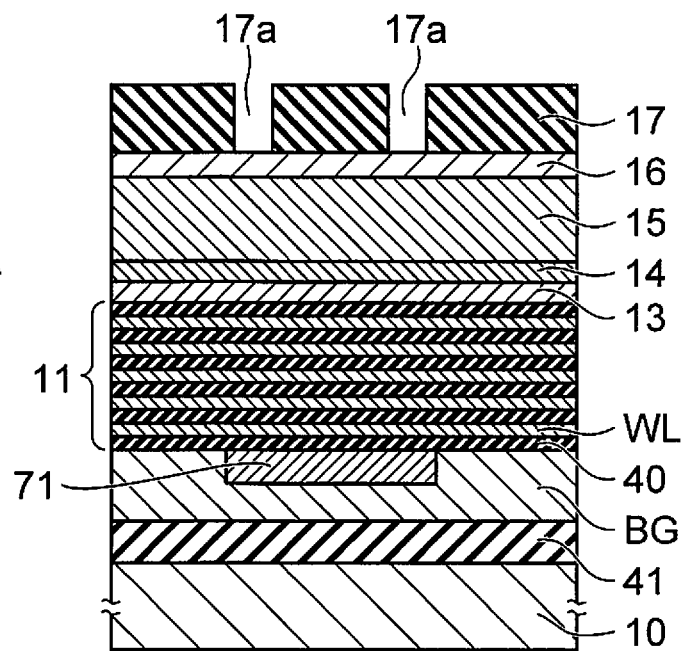
FIGS. 14A to 21C are schematic cross-sectional views showing a method for manufacturing a semiconductor memory device of the embodiment.

Similarly to the embodiment described above, the back gate BG, the first stacked unit 11, and the first intermediate layer 13 are formed on the substrate 10. Further, as shown in FIG. 14A, the second intermediate layer 14 is formed on the first intermediate layer 13.

A mask film for patterning the first stacked unit 11 is formed on the second intermediate layer 14. The mask film includes the carbon film 15 that is formed on the second intermediate layer 14, the mask intermediate film (e.g., the silicon oxide film) 16 that is formed on the carbon film 15, and the resist film 17 that is formed on the mask intermediate film 16.

The holes 17a are made in the resist film 17 by exposing and developing.

Using the resist film 17 in which the holes 17a are made as a mask, holes are made in the mask intermediate film 16 by, for example, patterning the mask intermediate film (the silicon oxide film) 16 by RIE using a gas including fluorine.

Figure 14B:
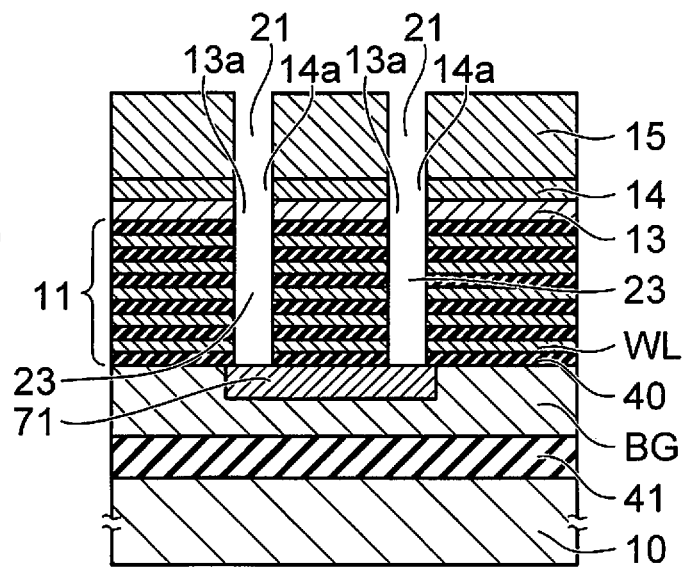

Continuing, using the mask intermediate film 16 in which the holes are made as a mask, the holes 21 are made in the carbon film 15 as shown in FIG. 14B by, for example, patterning the carbon film 15 by RIE using a gas including oxygen.

Continuing, using the carbon film 15 in which the holes 21 are made as a mask, the second intermediate layer 14, the first intermediate layer 13, and the first stacked unit 11 are patterned by RIE.

The etching gas that patterns the first intermediate layer 13 and the first stacked unit 11 is the same as that of the embodiment described above. Also, the second intermediate layer 14 which is made of the same type of material as the electrode layers WL is patterned using the same type of gas as the etching gas that patterns the first stacked unit 11.

As shown in FIG. 14B, second mask holes 14a are made in the second intermediate layer 14; the first mask holes 13a are made in the first intermediate layer 13; and the first holes 23 are made in the first stacked unit 11.

The carbon film 15 is removed by, for example, ashing.

Figure 15A:
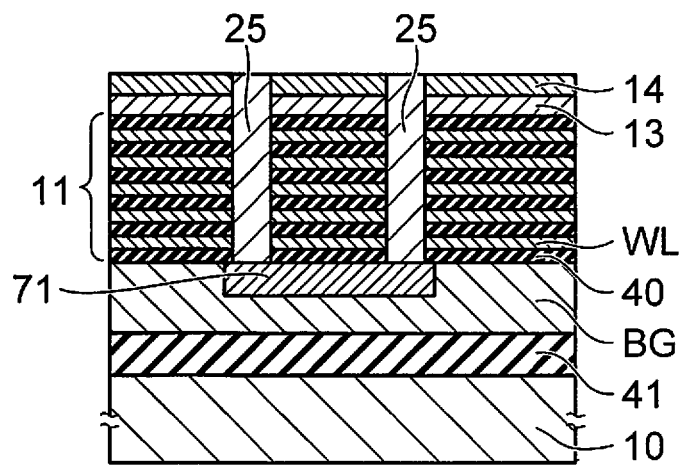

Then, as shown in FIG. 15A, the sacrificial film 25 is filled into the first holes 23, into the first mask holes 13a, and into the second mask holes 14a.

Figure 15B:
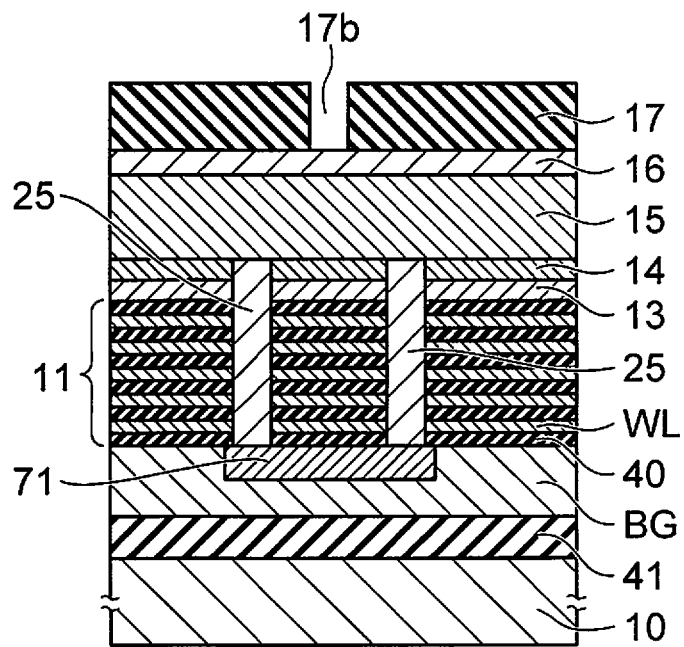

After forming the sacrificial film 25, similar to the description recited above, a mask film is formed on the second intermediate layer 14 as shown in FIG. 15B. The slit 17b is made in the resist film 17 by exposing and developing.

Using the resist film 17 in which the slit 17b is made as a mask, a slit is made in the mask intermediate film 16 by, for example, patterning the mask intermediate film (the silicon oxide film) 16 by RIE using a gas including fluorine.

Figure 16A:
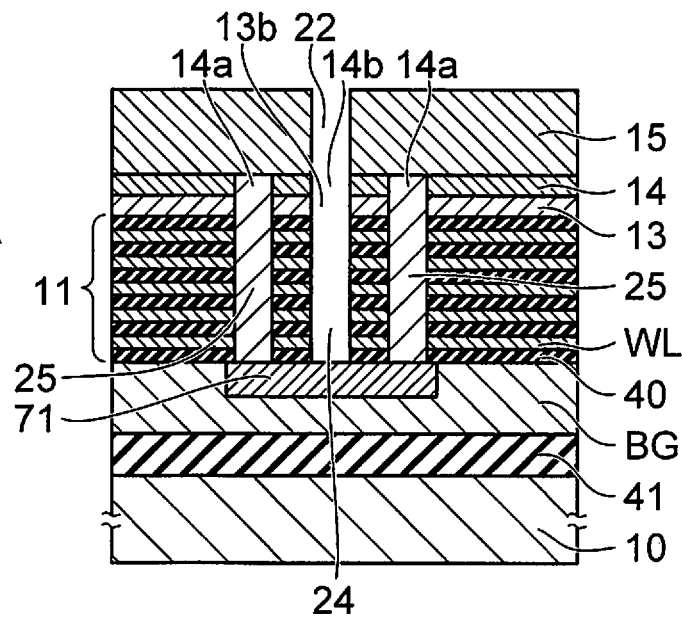

Continuing, using the mask intermediate film 16 in which the slit is made as a mask, the slit 22 is made in the carbon film 15 as shown in FIG. 16A by, for example, patterning the carbon film 15 by RIE using a gas including oxygen.

Continuing, using the carbon film 15 in which the slit 22 is made as a mask, the second intermediate layer 14, the first intermediate layer 13, and the first stacked unit 11 are patterned by RIE.

The etching gas that patterns the first intermediate layer 13 and the first stacked unit 11 is the same as that of the embodiment described above. Also, the second intermediate layer 14 that is made of the same type of material as the electrode layers WL is patterned using the same type of gas as the etching gas that patterns the first stacked unit 11.

As shown in FIG. 16A, a second mask slit 14b is made in the second intermediate layer 14; the first mask slit 13b is made in the first intermediate layer 13; and the first slit 24 is made in the first stacked unit 11.

The carbon film 15 is removed by, for example, ashing.

Figure 16B:
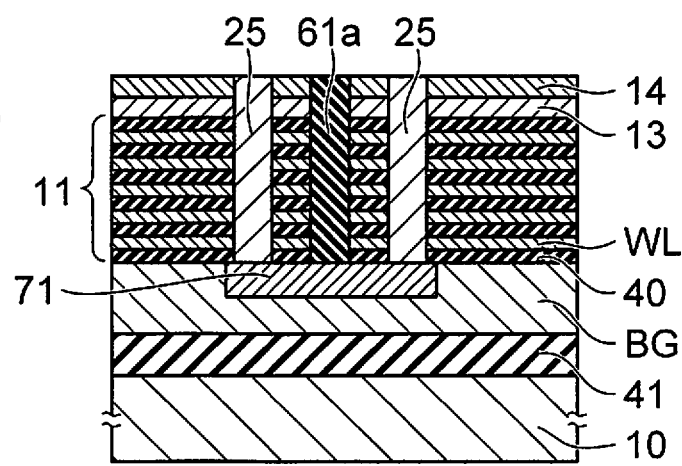

Then, as shown in FIG. 16B, the first insulating separation film 61a is filled into the first slit 24, into the first mask slit 13b, and into the second mask slit 14b.

Figure 17A:
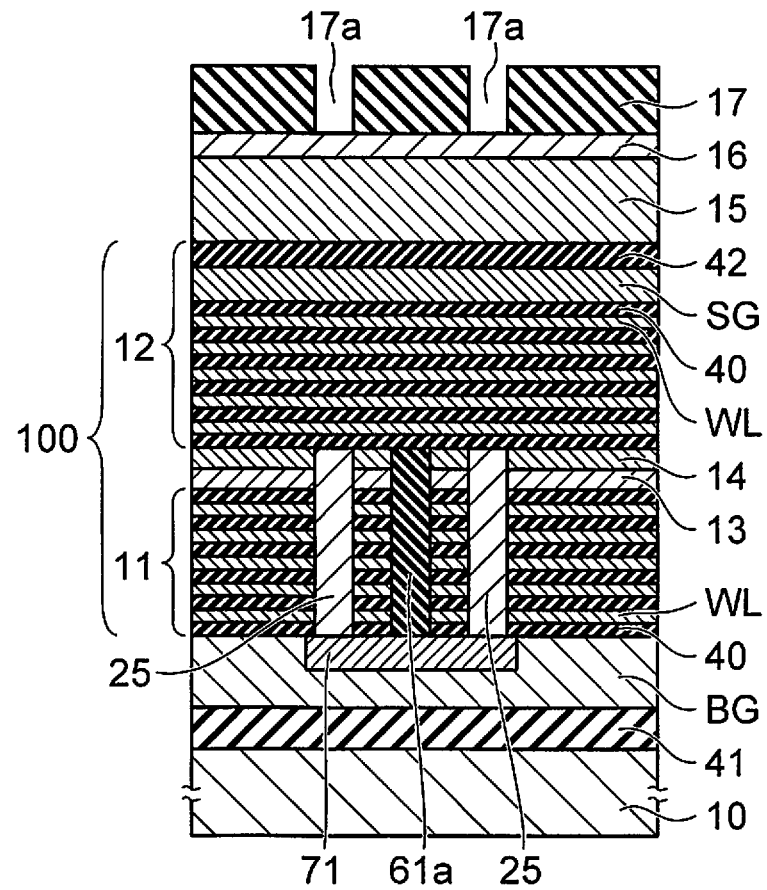

Then, as shown in FIG. 17A, the second stacked unit 12 is formed on the second intermediate layer 14. Further, the carbon film 15 is formed on the second stacked unit 12; the mask intermediate film (e.g., the silicon oxide film) 16 is formed on the carbon film 15; and the resist film 17 is formed on the mask intermediate film 16.

The holes 17a are made in the resist film 17 by exposing and developing.

Using the resist film 17 in which the holes 17a are made as a mask, holes are made in the mask intermediate film 16 by, for example, patterning the mask intermediate film 16 by RIE using a gas including fluorine. Continuing, using the mask intermediate film 16 in which the holes are made as a mask, the holes 21 are made in the carbon film 15 as shown in FIG. 17B by, for example, patterning the carbon film 15 by RIE using a gas including oxygen.

Then, using the carbon film 15 in which the holes 21 are made as a mask, the second stacked unit 12 and the second intermediate layer 14 are patterned by RIE.

The etching gas that patterns the second stacked unit 12 is the same as that of the embodiment described above. Also, the second intermediate layer 14 that is made of the same type of material as the electrode layers WL is patterned using the same type of gas as the etching gas that patterns the second stacked unit 12.

Figure 17B:
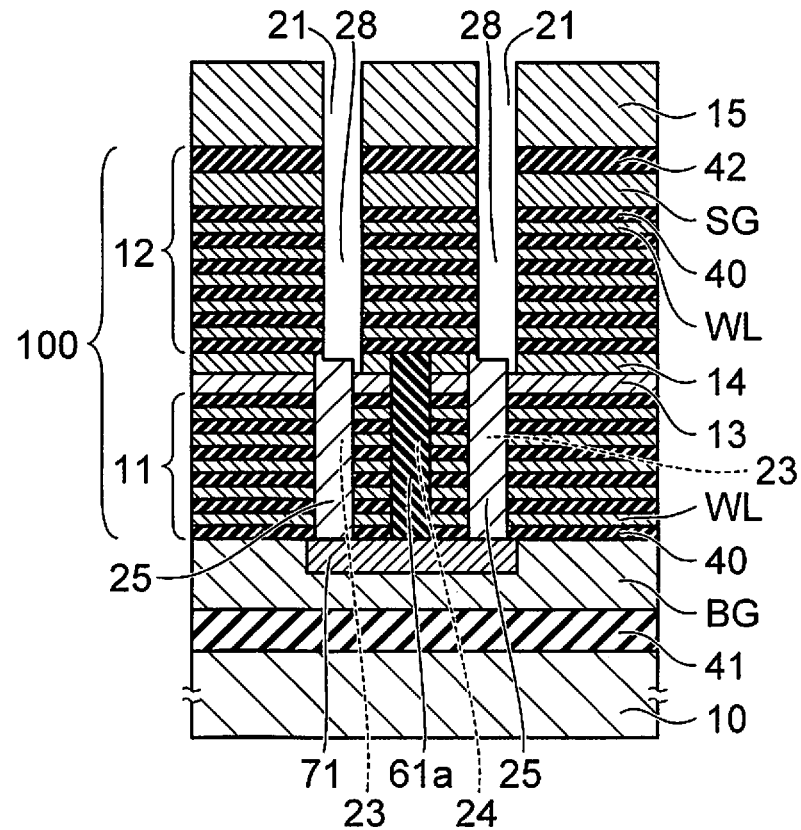

The second holes 28 are made in the second stacked unit 12 and the second intermediate layer 14 as shown in FIG. 17b by patterning by etching the second stacked unit 12 and the second intermediate layer 14.

The lower ends (the bottoms) of the second holes 28 reach the sacrificial film 25. Also, there are cases where the central axes of the second holes 28 are shifted from the central axes of the first holes 23 due to the alignment shift between the mask pattern when patterning the first stacked unit 11 and the mask pattern when patterning the second stacked unit 12.

In such a case, portions of the lower ends (the bottoms) of the second holes 28 jut in the diametral direction from the sacrificial film 25 to reach the first intermediate layer 13.

Figure 21C:
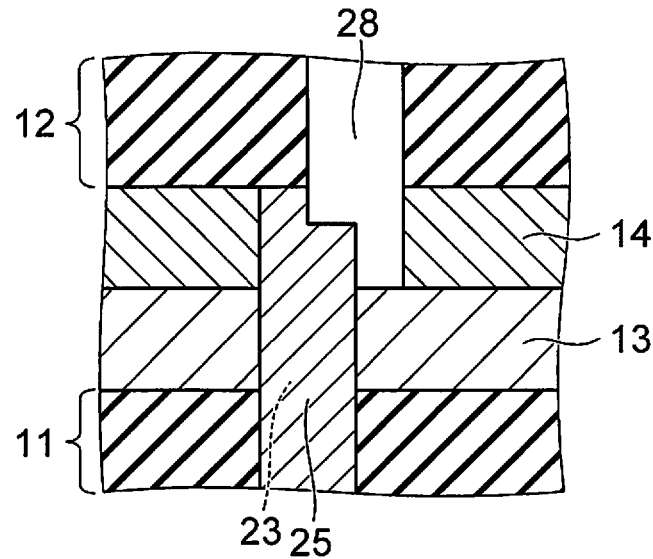

FIG. 21C is an enlarged cross-sectional view of a portion where the second hole 28 reaches the sacrificial film 25 and the first intermediate layer 13.

In the embodiment as well, both the sacrificial film (e.g., the silicon nitride film) 25 and the first intermediate layer (e.g., the tungsten silicide layer) 13 are made of materials different from the second stacked unit 12 (the first layers and the second layers) and have etching rates in the patterning of the second stacked unit 12 that are lower than that of the second stacked unit 12.

In other words, the first intermediate layer 13 has etching resistance to the etching gas when making the second hole 28 and functions as an etching stopper in the etching.

Accordingly, a high etching selectivity (the ratio of the etching rate of the second stacked unit 12 to the etching rate of the first intermediate layer 13) is obtained when making the second hole 28.

In the embodiment as well, even in the case where the etching of the second hole 28 progresses so that the central axis is shifted from the first hole 23 (the sacrificial film 25) made in the first stacked unit 11, the second hole 28 can be prevented from reaching the first stacked unit 11 without the first intermediate layer 13 being etched excessively. Accordingly, the characteristic fluctuation between the memory cells in the stacking direction can be suppressed by suppressing the fluctuation of the configuration and dimensions of the columnar portion CL of the first stacked unit 11.

Further, the second intermediate layer 14 is provided on the first intermediate layer 13. Prior to the patterning of the second stacked unit 12, the first hole 23 is pre-made also in the second intermediate layer 14 in the patterning of the first stacked unit 11. Then, the second intermediate layer 14 is made of the same type of material as the second stacked unit 12. Also, the etching resistance to the etching gas when making the second hole 28 is lower for the second intermediate layer 14 than for the first intermediate layer 13. In other words, the etching rate of the second intermediate layer 14 is higher than that of the first intermediate layer 13 when making the second hole 28.

Accordingly, in the case where the etching progresses so that the bottom of the second hole 28 is shifted from directly above the first hole 23 (the sacrificial film 25), the second intermediate layer 14 that is in the region shifted from directly above the first hole 23 (the sacrificial film 25) is etched.

Therefore, the diameter of the portion where the first hole 23 and the second hole 28 connect at the second intermediate layer 14 is larger than the diameter of the first hole 23.

Accordingly, even in the case where the positional shift amount between the first hole 23 and the second hole 28 is large, and even in the case where etching of the first intermediate layer 13 substantially does not occur when making the second hole 28, the first hole 23 and the second hole 28 overlap in the stacking direction at least by the amount of the thickness of the second intermediate layer 14; and the constriction of the hole diameter of the portion can be prevented reliably. As a result, the formation of various films on the inner walls of the holes 23 and 28 is not impeded.

Figure 18A:
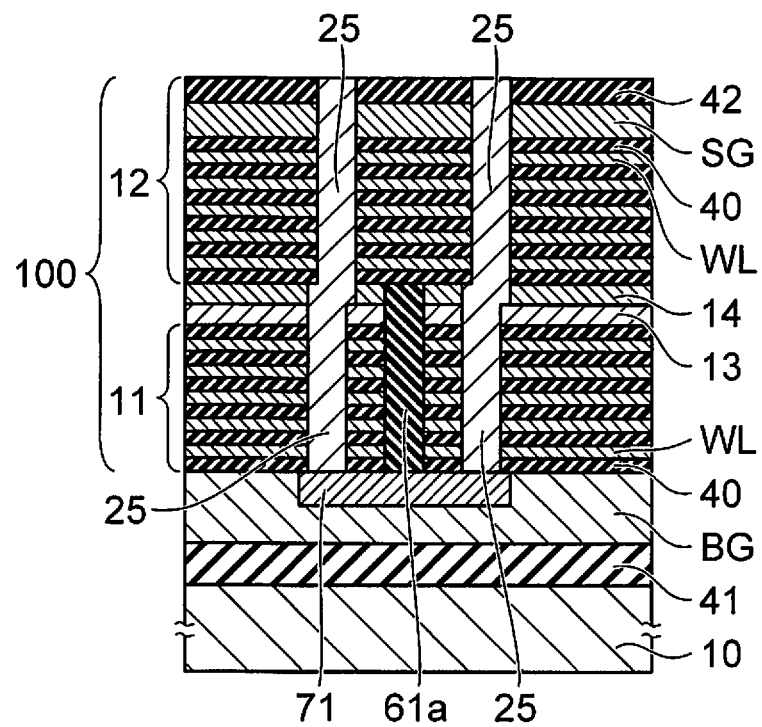

After making the second hole 28, the carbon film 15 is removed by, for example, ashing. Subsequently, the sacrificial film 25 is filled into the second hole 28 as shown in FIG. 18A.

Figure 18B:
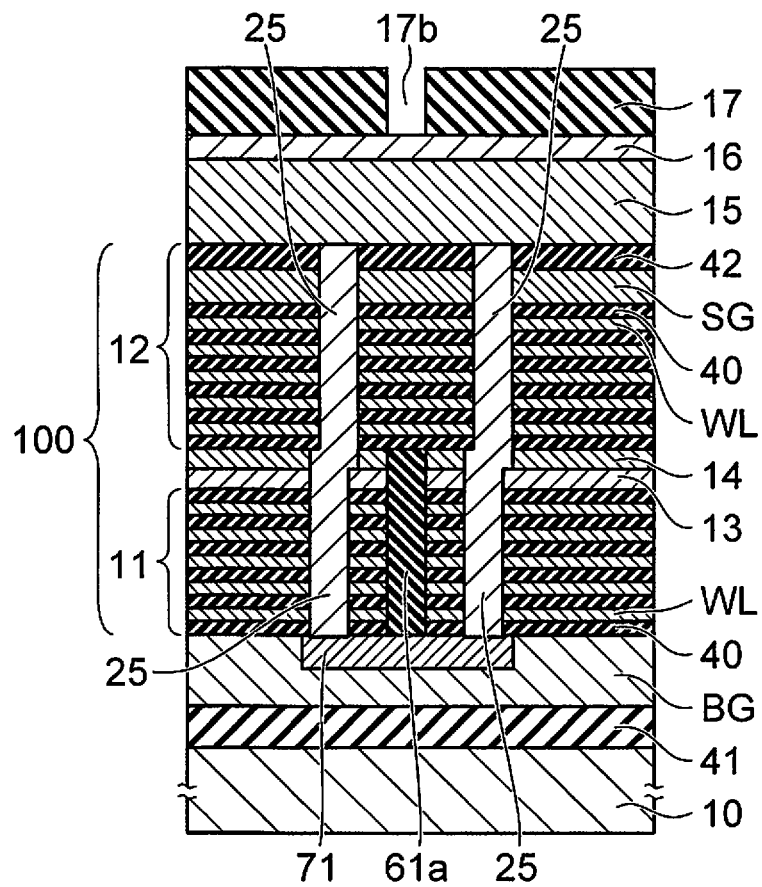

Then, as shown in FIG. 18B, the carbon film 15 is formed on the second stacked unit 12; the mask intermediate film (e.g., the silicon oxide film) 16 is formed on the carbon film 15; and the resist film 17 is formed on the mask intermediate film 16.

The slit 17b is made in the resist film 17 by exposing and developing.

Using the resist film 17 in which the slit 17b is made as a mask, a slit is made in the mask intermediate film 16 by, for example, patterning the mask intermediate film 16 by RIE using a gas including fluorine. Continuing, using the mask intermediate film 16 in which the slit is made as a mask, the slit 22 is made in the carbon film 15 as shown in FIG. 19A by, for example, patterning the carbon film 15 by RIE using a gas including oxygen.

Then, using the carbon film 15 in which the slit 22 is made as a mask, the second stacked unit 12 and the second intermediate layer 14 are patterned by RIE.

The etching gas that patterns the second stacked unit 12 is the same as that of the embodiment described above. Also, the second intermediate layer 14 which is made of the same type of material as the electrode layers WL is patterned using the same type of gas as the etching gas that patterns the second stacked unit 12.

Figure 19A:
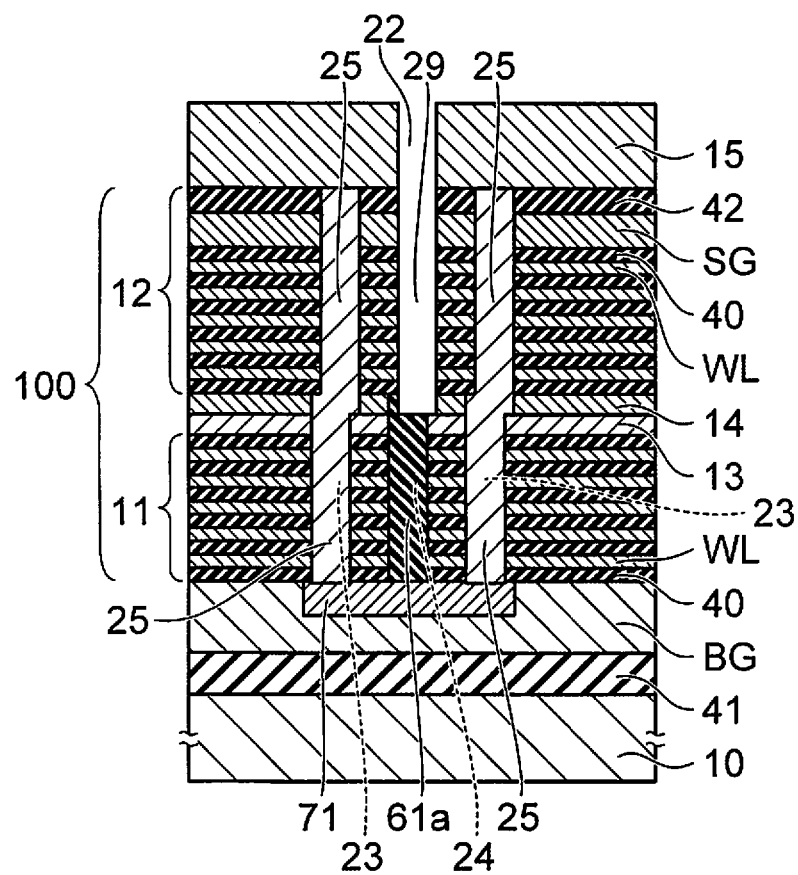

The second slit 29 is made in the second stacked unit 12 and the second intermediate layer 14 as shown in FIG. 19A by patterning by etching the second stacked unit 12 and the second intermediate layer 14.

The lower end (the bottom) of the second slit 29 reaches the first insulating separation film 61a. Also, there are cases where the center (the width-direction center) of the second slit 29 is shifted from the center (the width-direction center) of the first slit 24 due to the alignment shift between the mask pattern when patterning the first stacked unit 11 and the mask pattern when patterning the second stacked unit 12.

In such a case, a portion of the lower end (the bottom) of the second slit 29 juts in the width direction from the first insulating separation film 61a to reach the first intermediate layer 13.

The first intermediate layer (e.g., the tungsten silicide layer) 13 is made of a material different from the second stacked unit 12 (the first layers and the second layers) and has an etching rate in the patterning of the second stacked unit 12 that is lower than that of the second stacked unit 12. In other words, the first intermediate layer 13 has etching resistance to the etching gas when making the second slit 29 and functions as an etching stopper in the etching.

Accordingly, a high etching selectivity (the ratio of the etching rate of the second stacked unit 12 to the etching rate of the first intermediate layer 13) is obtained when making the second slit 29.

Even in the case where the etching of the second slit 29 progresses so that the center is shifted from the first slit 24 (the first insulating separation film 61a) made in the first stacked unit 11, the second slit 29 can be prevented from reaching the first stacked unit 11 without the first intermediate layer 13 being etched excessively.

Therefore, the fluctuation in the stacking direction of the distance between the first insulating separation film 61a and the columnar portion CL in the first stacked unit 11 can be suppressed; and as a result, the fluctuation of the characteristics of the memory cells in the stacking direction can be suppressed.

Further, the second intermediate layer 14 is provided on the first intermediate layer 13. Prior to the patterning of the second stacked unit 12, the first slit 24 is pre-made also in the second intermediate layer 14 in the patterning of the first stacked unit 11. Then, the second intermediate layer 14 is made of the same type of material as the second stacked unit 12. Also, the etching resistance to the etching gas when making the second slit 29 is lower for the second intermediate layer 14 than for the first intermediate layer 13. In other words, the etching rate of the second intermediate layer 14 is higher than that of the first intermediate layer 13 when making the second slit 29.

Accordingly, in the case where the etching progresses so that the bottom of the second slit 29 is shifted from directly above the first slit 24 (the first insulating separation film 61a), the second intermediate layer 14 in the region shifted from directly above the first slit 24 (the first insulating separation film 61a) is etched.

Therefore, the width of the portion where the first slit 24 and the second slit 29 connect at the second intermediate layer 14 is wider than the width of the first slit 24.

Accordingly, even in the case where the positional shift amount between the first slit 24 and the second slit 29 is large, and even in the case where etching of the first intermediate layer 13 substantially does not occur when making the second slit 29, the first slit 24 and the second slit 29 overlap in the stacking direction at least by the amount of the thickness of the second intermediate layer 14; and the constriction of the slit width at the portion can be prevented reliably.

As a result, the widths of the insulating separation films 61a and 61b filled into the slits 24 and 29 can be prevented from becoming partially narrow; and leaks between the electrode layers WL that oppose each other with the insulating separation films 61a and 61b interposed between the electrode layers WL can be prevented.

Figure 19B:
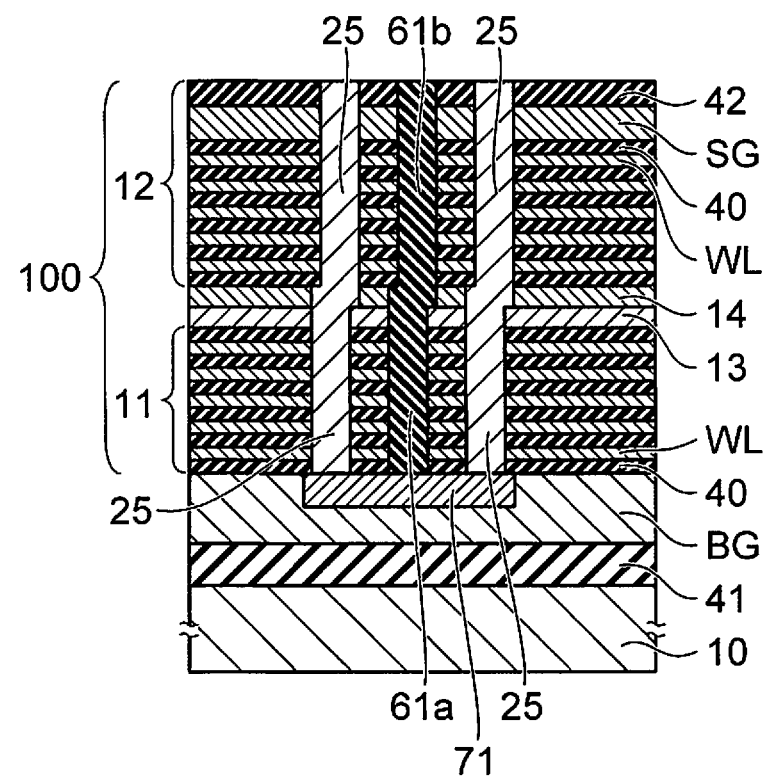

After making the second slit 29, the carbon film 15 is removed by, for example, ashing. Subsequently, the second insulating separation film 61b is filled into the second slit 29 as shown in FIG. 19B.

Then, the sacrificial film (the silicon nitride film) 25 is removed. At this time, the insulating layer 42 of the uppermost layer which is, for example, a silicon oxide film is used as an etching mask.

Figure 20A:
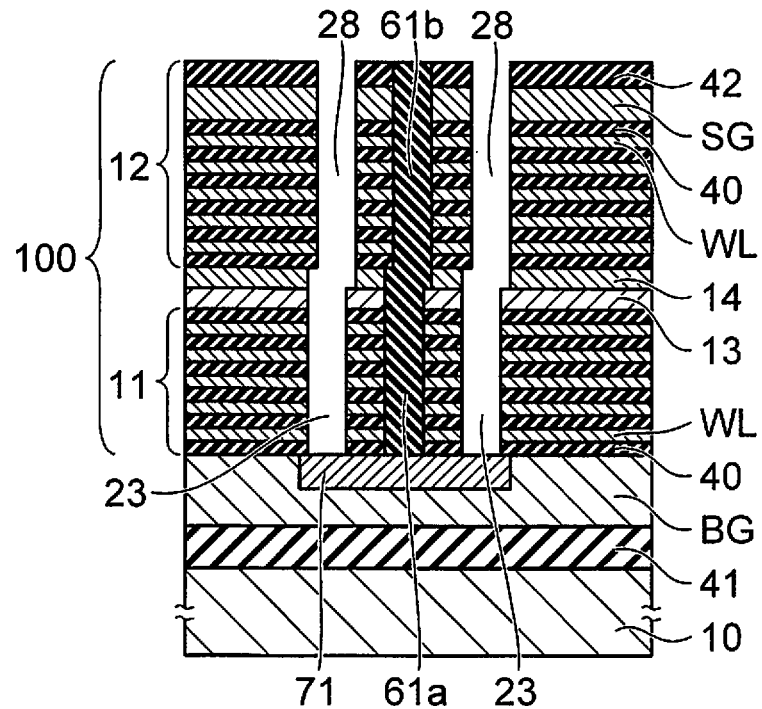

By the removal of the sacrificial film 25 as shown in FIG. 20A, the first hole 23 that is made in the first stacked unit 11 and the second hole 28 that is made in the second stacked unit 12 appear. The first hole 23 and the second hole 28 are connected in the stacking direction.

Continuing, the sacrificial film 71 that is filled into the back gate BG is removed via the first hole 23 and the second hole 28.

The sacrificial film 25 and the sacrificial film 71 are silicon nitride films and can be removed by, for example, hot phosphoric acid. At this time, the insulating separation films 61a and 61b which are silicon oxide films are not removed.

Figure 20B:
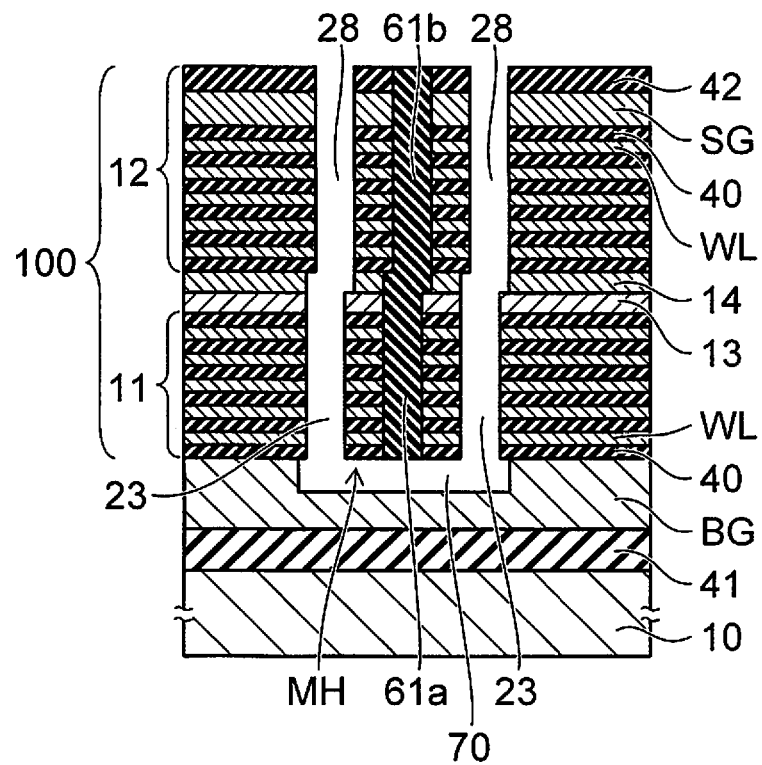

By the removal of the sacrificial film 71 as shown in FIG. 20B, the recess 70 that is made in the back gate BG appears; and the lower end of the first hole 23 is connected to the recess 70. Accordingly, the recess 70, a pair of the first holes 23, and a pair of the second holes 28 are connected; and the memory hole MH having the U-shaped configuration is made.

After making the memory hole MH, each of the films shown in FIG. 13A are formed in order on the inner wall of the memory hole MH. In other words, the memory film 30, the channel body 20, and the core insulating film 50 are formed inside the memory hole MH.

Figure 22:
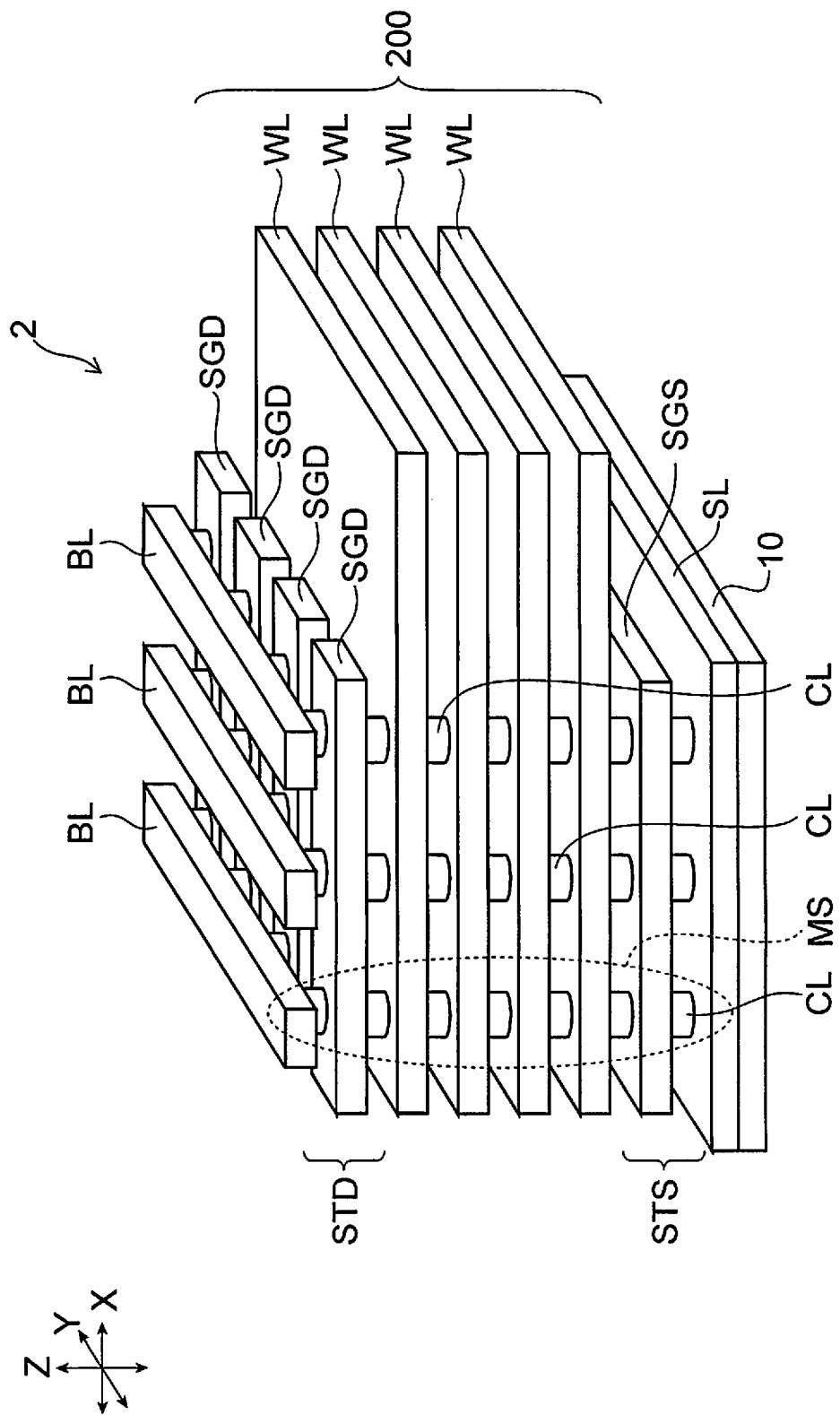
FIG. 22 is a schematic perspective view of a memory cell array of another example of the embodiment.

Then, FIG. 22 is a schematic perspective view of a memory cell array 2 of another example of the semiconductor memory device of the embodiment. In FIG. 22 as well, similarly to FIG. 1, the insulating layers, etc., are not shown for easier viewing of the drawing. Also, the first intermediate layer 13 and the second intermediate layer 14 are not shown.

In FIG. 22, two mutually-orthogonal directions that are directions parallel to the major surface of the substrate 10 are taken as the X-direction and the Y-direction; and a direction orthogonal to both the X-direction and the Y-direction is taken as the Z-direction (the stacking direction).

The source layer SL is provided on the substrate 10. The source-side selection gate (the lower gate layer) SGS is provided on the source layer SL with the insulating layer interposed.

An insulating layer is provided on the source-side selection gate SGS; and multiple layers of the electrode layers WL and multiple layers of insulating layers are stacked alternately on the insulating layer.

An insulating layer is provided on the electrode layer WL of the uppermost layer; and the drain-side selection gate (the upper gate layer) SGD is provided on the insulating layer.

In other words, a stacked body 200 that includes the source-side selection gate SGS, the electrode layers WL, an inter-electrode layer insulating layer, and the drain-side selection gate SGD is provided on the substrate 10.

The columnar portion CL that extends in the Z-direction is provided in the stacked body 200. The configuration of the columnar portion CL is the same as that of the embodiment described above.

The columnar portion CL pierces the drain-side selection gate SGD, the multiple layers of the electrode layers WL, and the source-side selection gate SGS. The upper end of the channel body 20 of the columnar portion CL is connected to the bit line BL; and the lower end of the channel body 20 is connected to the source line SL.

In the memory cell array 2 shown in FIG. 22 as well, the stacked body 200 has a configuration in which multiple stacked units are stacked with the first intermediate layer 13 interposed. Or, the second intermediate layer 14 may be provided on the first intermediate layer 13.

The cross-sectional structure of the portion (the portion pierced by the columnar portion CL) in which the electrode layers WL are stacked between the lower gate layer and the upper gate layer is a cross-sectional structure similar to that of FIG. 2A or FIG. 13A.

The holes and the slits described above are not limited to being made in the stacked units of the electrode layers WL and the insulating layers 40; and holes and/or slits may be made in stacked units of the first layers and the second layers; the first layers or the second layers may be removed subsequently by etching via the holes or the slits; and the electrode layers WL or the insulating layers 40 may be formed in the spaces where the first layers or the second layers are removed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device, comprising:
a source layer;
a lower stacked unit provided above the source layer, the lower stacked unit including a plurality of lower electrode layers alternately stacked in a stacking direction with a plurality of lower insulating layers therebetween;
an upper stacked unit provided above the lower stacked unit, the upper stacked unit including a plurality of upper electrode layers alternately stacked in the stacking direction with a plurality of upper insulating layers therebetween;
a bit line provided above the upper stacked unit;
a lower columnar part piercing the lower stacked unit in the stacking direction, the lower columnar part including a lower core insulator part and a lower tubular part extending inside the lower electrode layers in the stacking direction around an outer circumferential surface of the lower core insulator part;
an upper columnar part piercing the upper stacked unit in the stacking direction, the upper columnar part including an upper core insulator part and an upper tubular part extending inside the upper electrode layers in the stacking direction around an outer circumferential surface of the upper core insulator part; and
an intermediate portion provided above the lower stacked unit and below the upper stacked unit,
wherein a portion of the upper core insulator part overlaps with the lower tubular part when projected from the stacking direction, and
the upper core insulator part has a lower end portion at a height corresponding to the intermediate portion in the stacking direction and the lower end portion of the upper core insulator part overlaps with the lower tubular part when projected from the stacking direction.

2. The device according to claim 1, wherein
the intermediate portion includes a material different from the lower and upper electrode layers and the lower and upper insulating layers.

3. The device according to claim 1, wherein
the intermediate portion includes a metal element.

4. The device according to claim 1, wherein
the intermediate portion includes silicon.

5. The device according to claim 1, wherein
the lower and upper electrode layers include silicon and the lower and upper insulating layers include silicon oxide.

6. The device according to claim 1, wherein
the lower and upper core insulator parts include silicon oxide.

7. The device according to claim 1, wherein
the lower electrode layers include a source-side selection gate layer.

8. The device according to claim 1, wherein
the lower tubular part includes a semiconductor film with a tubular configuration and an insulating film provided around an outer circumferential surface of the semiconductor film.

9. A semiconductor memory device, comprising:
a source layer;
a stacked body provided above the source layer, the stacked body including:
- a lower stacked unit and an upper stacked unit stacked above the lower stacked unit, each of the lower and upper stacked units including a plurality of electrode layers alternately stacked in a stacking direction with a plurality of insulating layers therebetween, and
- an intermediate portion including a silicon-containing layer provided above the lower stacked unit and below the upper stacked unit;

a bit line provided above the stacked body; and
a columnar member piercing the stacked body in the stacking direction, the columnar member including a first semiconductor portion with a tubular configuration extending inside the lower stacked unit, a second semiconductor portion with a tubular configuration extending inside the upper stacked unit and a third semiconductor portion with a tubular configuration extending inside the intermediate portion; wherein
a core insulator is provided inside at least the second and third semiconductor portions with the tubular configuration and a length of the core insulator in a first direction perpendicular to the stacking direction is expanded locally at a height corresponding to the silicon-containing layer of the intermediate portion.

10. The device according to claim 9, wherein
the electrode layers include silicon and the insulating layers include silicon oxide.

11. The device according to claim 9, wherein
the core insulator includes silicon oxide.

12. The device according to claim 9, wherein
the core insulator is further provided inside the first semiconductor portion with the tubular configuration.

13. The device according to claim 9, wherein
a portion of the core insulator whose length is expanded locally in the first direction overlaps with the first semiconductor portion when projected from the stacking direction.

14. A semiconductor memory device, comprising:
a source layer;
a stacked body provided above the source layer, the stacked body including:
- a lower stacked unit provided above the source layer, the lower stacked unit including a plurality of first electrode layers alternately stacked in a stacking direction with a plurality of first insulating layers therebetween;
- an upper stacked unit provided above the lower stacked unit, the upper stacked unit including a plurality of second electrode layers alternately stacked in the stacking direction with a plurality of second insulating layers therebetween, and
- an intermediate structure provided above the lower stacked unit and below the upper stacked unit;

a bit line provided above the stacked body; and
a columnar member piercing the stacked body in the stacking direction, the columnar member including a lower semiconductor portion extending inside the lower stacked unit in the stacking direction and an upper semiconductor portion extending inside the upper stacked unit and inside an upper side portion of the intermediate structure in the stacking direction, the upper side portion of the intermediate structure including a silicon;
wherein the upper semiconductor portion has a tubular configuration and a core insulator is provided inside the upper semiconductor portion with the tubular configuration, the core insulator extending inside the upper side portion of the intermediate structure along the stacking direction with a maximum length in a first direction perpendicular to the stacking direction, the maximum length being greater than a diameter of the core insulator in the first direction at a height corresponding to a lowermost second electrode layer of the second electrode layers in the upper stacked unit.

15. The device according to claim 14, wherein
the first and second electrode layers include silicon and the first and second insulating layers include silicon oxide.

16. The device according to claim 14, wherein
the core insulator includes silicon oxide.

17. The device according to claim 14, wherein
the lower semiconductor portion further extends inside a lower side portion of the intermediate structure in the stacking direction.

18. The device according to claim 14, wherein
the lower semiconductor portion and the second semiconductor portion are electrically connected between the source layer and the bit line.

19. The device according to claim 14, wherein
the first electrode layers include a source-side selection gate layer.

20. The device according to claim 9, wherein
the first to third semiconductor portions are electrically connected between the source layer and the bit line.

* * * * *